US011824009B2

United States Patent
Tanaka

(10) Patent No.: US 11,824,009 B2
(45) Date of Patent: Nov. 21, 2023

(54) SEMICONDUCTOR DEVICE AND DATA TRANSFERRING METHOD FOR SEMICONDUCTOR DEVICE

(71) Applicant: Preferred Networks, Inc., Tokyo (JP)

(72) Inventor: Nobuyoshi Tanaka, Tokyo (JP)

(73) Assignee: Preferred Networks, Inc., Tokyo (JP)

( * ) Notice: Subject to any disclaimer, the term of this patent is extended or adjusted under 35 U.S.C. 154(b) by 461 days.

(21) Appl. No.: 16/705,645

(22) Filed: Dec. 6, 2019

(65) Prior Publication Data
US 2020/0185328 A1    Jun. 11, 2020

(30) Foreign Application Priority Data

Dec. 10, 2018  (JP) .................................. 2018-231125
Dec. 10, 2018  (JP) .................................. 2018-231126

(51) Int. Cl.
| | |
|---|---|
| *H01L 23/538* | (2006.01) |
| *H01L 25/065* | (2023.01) |
| *H01L 23/06* | (2006.01) |
| *H01L 23/31* | (2006.01) |
| *H01L 23/433* | (2006.01) |

(Continued)

(52) U.S. Cl.
CPC ...... *H01L 23/5386* (2013.01); *G06F 11/1068* (2013.01); *H01L 23/06* (2013.01); *H01L 23/3128* (2013.01); *H01L 23/367* (2013.01); *H01L 23/433* (2013.01); *H01L 24/16* (2013.01); *H01L 24/17* (2013.01); *H01L 25/0655* (2013.01); *H01L 2224/16225* (2013.01); *H01L 2224/17179* (2013.01)

(58) Field of Classification Search
None
See application file for complete search history.

(56) References Cited

U.S. PATENT DOCUMENTS 6,252,264 B1 *  6/2001  Bailey ................ H01L 25/0655
                                                  257/723
7,382,620 B2 *  6/2008  Khanna .................. H01L 23/42
                                                  361/708

(Continued)

FOREIGN PATENT DOCUMENTS

| JP | H02-226753 | 9/1990 |
|----|------------|--------|
| JP | H09-064269 | 3/1997 |

(Continued)

OTHER PUBLICATIONS

T. Kirihata et al., "Three-Dimensional Dynamic Random Access Memories Using Through-Silicon-Vias," in IEEE Journal on Emerging and Selected Topics in Circuits and Systems, vol. 6, No. 3, pp. 373-384, Sep. 2016, doi: 10.1109/JETCAS.2016.2547738. (Year: 2016).*

*Primary Examiner* — Daniel F. McMahon
(74) *Attorney, Agent, or Firm* — IPUSA, PLLC

(57) ABSTRACT

A semiconductor device includes a first chip, a second chip, a third chip, a fourth chip, and a substrate. The first to fourth chips are mounted on the substrate. The first chip is placed adjacent to the second chip and the fourth chip. The third chip is placed adjacent to the second chip and the fourth chip at a position different from that of the first chip. The second chip has a first transferring circuit that transfers data from the first chip to the third chip, and the fourth chip has a second transferring circuit that transfers data from the third chip to the first chip.

20 Claims, 16 Drawing Sheets

(51) Int. Cl.
  *H01L 23/00* (2006.01)
  *G06F 11/10* (2006.01)
  *H01L 23/367* (2006.01)

(56) References Cited

U.S. PATENT DOCUMENTS

| | | | |
|---|---|---|---|
| 8,446,020 | B2 | 5/2013 | Koide et al. |
| 8,901,749 | B2 * | 12/2014 | Kim ................ H01L 25/18 257/777 |
| 9,853,015 | B1 * | 12/2017 | Fan ................ H01L 25/0652 |
| 2002/0180030 | A1 * | 12/2002 | Oyama ............ H01L 23/5382 257/E25.023 |
| 2008/0134105 | A1 | 6/2008 | Nakatake et al. |
| 2009/0209061 | A1 * | 8/2009 | Jeong ................ H01L 24/91 257/E21.602 |
| 2012/0089814 | A1 | 4/2012 | Gupta et al. |
| 2013/0249108 | A1 * | 9/2013 | Jung ................ H01L 25/50 438/109 |
| 2016/0019183 | A1 | 1/2016 | Thurston et al. |
| 2016/0240497 | A1 | 8/2016 | Chen et al. |
| 2017/0060801 | A1 * | 3/2017 | Lee ................ G06F 13/4068 |
| 2017/0125393 | A1 | 5/2017 | Kwon et al. |
| 2017/0154868 | A1 * | 6/2017 | Jo ................ H01L 25/0652 |
| 2018/0067801 | A1 * | 3/2018 | Yun ................ G06F 11/1048 |
| 2018/0074895 | A1 * | 3/2018 | Choi ................ G06F 11/1048 |
| 2019/0244946 | A1 * | 8/2019 | Kim ................ H01L 23/3128 |
| 2019/0295986 | A1 * | 9/2019 | Oh ................ H01L 25/0652 |
| 2020/0020670 | A1 * | 1/2020 | Koyanagi ........ H01L 23/5226 |
| 2020/0051890 | A1 * | 2/2020 | Fricker ................ C09K 5/14 |
| 2020/0303030 | A1 * | 9/2020 | Lee ................ G11C 8/06 |

FOREIGN PATENT DOCUMENTS

| | | |
|---|---|---|
| JP | 2008-140011 | 6/2008 |
| JP | 2011-086820 | 4/2011 |
| JP | 2011-520134 | 7/2011 |
| JP | 2017-117499 | 6/2017 |
| JP | 2017-528946 | 9/2017 |
| WO | 2009/114283 | 9/2009 |

* cited by examiner

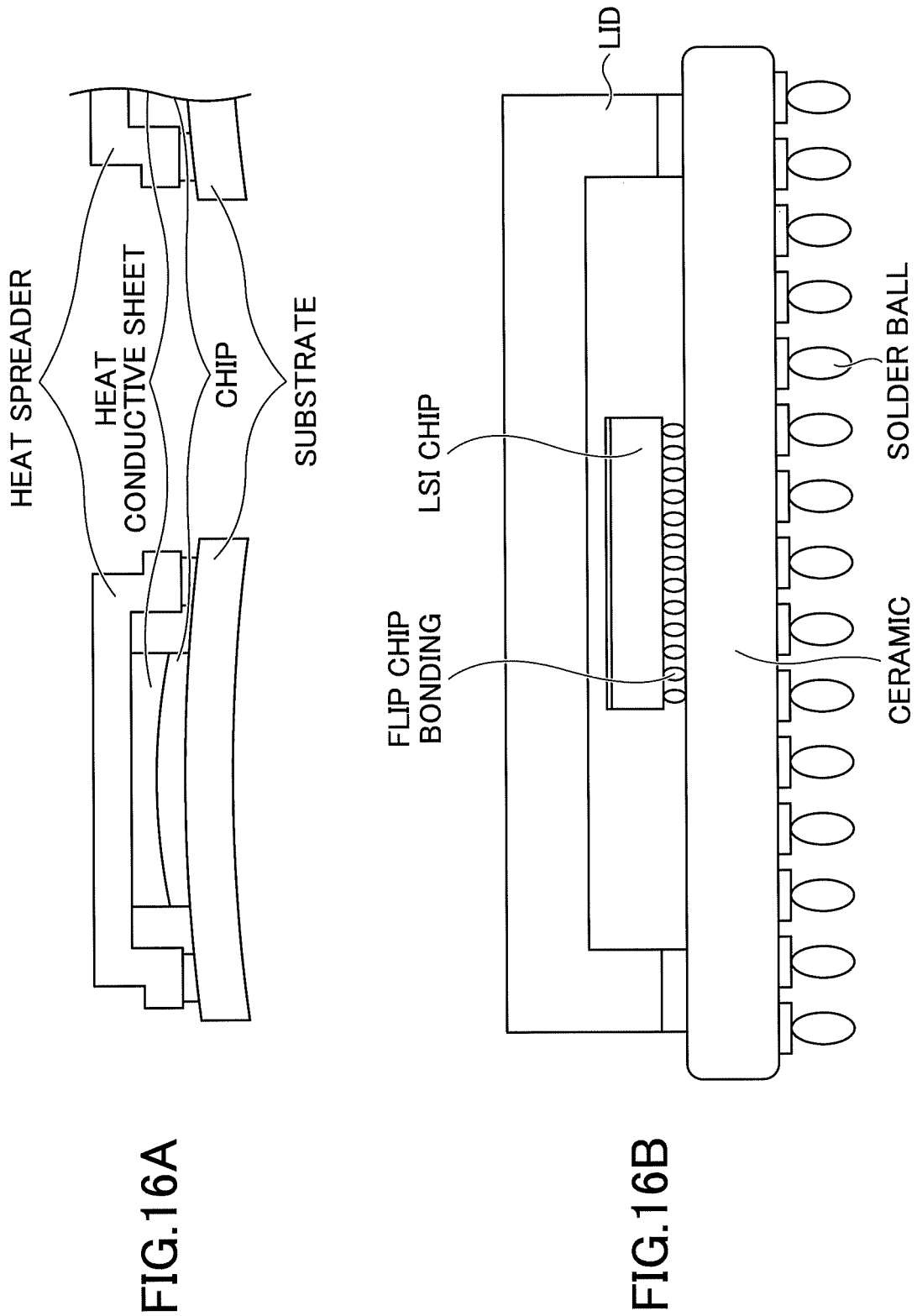

SEMICONDUCTOR DEVICE AND DATA TRANSFERRING METHOD FOR SEMICONDUCTOR DEVICE

BACKGROUND

1. Technical Field

The disclosure herein relates to semiconductor devices and data transferring methods for the semiconductor devices.

2. Description of the Related Art

A multi-chip module type of semiconductor device, where multiple chips are mounted on a substrate, is known. For example, for a multi-chip module having multiple chips aligned on a substrate such as a silicon interposer, wires formed on a wire layer of the substrate are used for electrical coupling between the chips.

SUMMARY

In the case where the multiple chips are coupled to each other, for example, the chips can be coupled to each other via wires provided between mutually facing edges. However, there are some cases where it may be difficult to provide the wires between two chips located on diagonal lines of placement areas thereof.

One objective of the present disclosure is to provide semiconductor devices that enable satisfactory inter-chip communications.

One aspect of the present disclosure relates to a semiconductor device, comprising: a first chip; a second chip; a third chip; and a fourth chip; and a substrate, the first to fourth chips mounted on the substrate, wherein the first chip is placed adjacent to the second chip and the fourth chip, the third chip is placed adjacent to the second chip and the fourth chip at a position different from that of the first chip, the second chip has a first transferring circuit that transfers data from the first chip to the third chip, and the fourth chip has a second transferring circuit that transfers data from the third chip to the first chip.

A further aspect of the present disclosure relates to a data transferring method for a semiconductor device, wherein the semiconductor device includes a first chip, a second chip, a third chip, a fourth chip and a substrate, the first to fourth chips mounted on the substrate, comprising: transferring data from the first chip to the third chip via a first transferring circuit, the first chip placed adjacent to the second and fourth chips, the second chip including the first transferring circuit; and transferring data from the third chip to the first chip via a second transferring circuit, the third chip placed adjacent to the second and fourth chips at a position different from that of the first chip, the fourth chip including the second transferring circuit.

A still further aspect of the present disclosure relates to a semiconductor device, comprising: a first chip; a second chip; and a third chip, wherein the first to third chips are mounted on a substrate, in a planar view, the first chip is placed adjacent to the second chip; the third chip is placed adjacent to the second chip to face the first chip via an unoccupied area of the substrate, wherein the unoccupied area is surrounded with edges of the first to third chips and is exposed from the first to third chips; and a first signal line for coupling between the first chip and the third chip is wired in the unoccupied area.

BRIEF DESCRIPTION OF THE DRAWINGS

Other objects and further features of the present disclosure will be apparent from the following detailed description when read in conjunction with the accompanying drawings, in which:

FIGS. 16A and 16B are cross-sectional views for illustrating exemplary semiconductor devices according to another embodiment of the present disclosure.

DETAILED DESCRIPTION

Embodiments of the present disclosure are described in detail below with reference to the drawings. In the following, symbols indicative of signal lines may be also used as signal names (data names). Also, embodiments of the present disclosure are described below in a planar view (for example, a view from the direction of overlapping of the substrate BRD in FIG. 1 with chips CPs (CP1 to CP4) mounted and implemented on the substrate BRD), unless specifically stated otherwise.

First Embodiment

Figure 1:
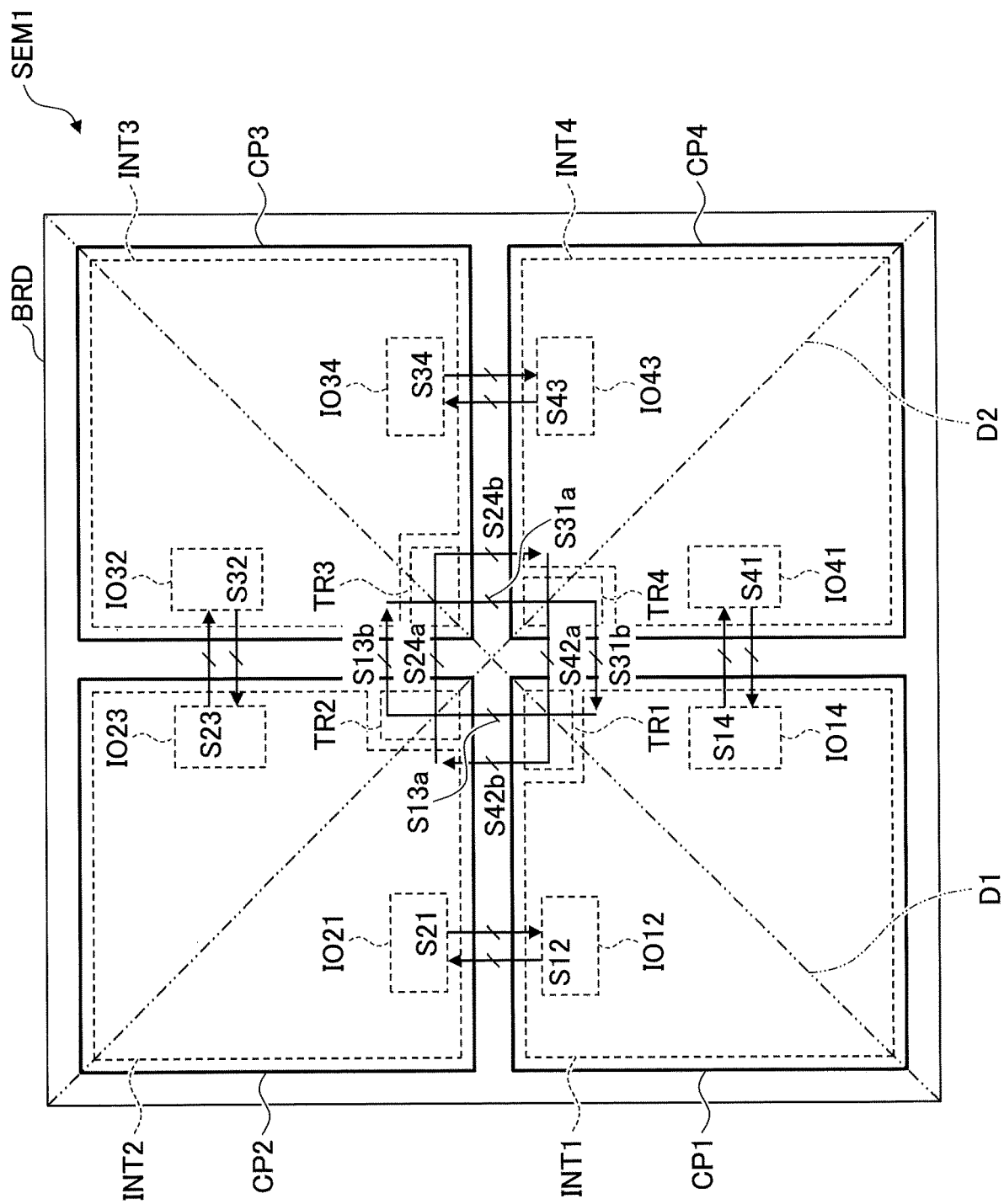
FIG. 1 is a block diagram for illustrating one exemplary semiconductor device according to one embodiment of the present disclosure.

FIG. 1 is a block diagram for illustrating one exemplary semiconductor device according to one embodiment of the present disclosure. A semiconductor device SEM1 in FIG. 1 has four semiconductor chips CPs (a first chip CP1, a second chip CP2, a third chip CP3 and a fourth chip CP4, which may be simply referred to as the chip CP1, the chip CP2, the chip CP3 and the chip CP4, respectively, hereinafter) placed in two rows by two columns on the substrate BRD in a planar view, each of which has an almost square shape (one type of rectangular shape) with four edges. In other words, the respective chips CP1 to CP4 are provided at different positions on the substrate BRD in the planar view.

For example, the respective chips CP1 to CP4 are coupled to terminals of the substrate BRD via bumps provided on the rear surface opposite to the substrate BRD. Parts (electrical parts and/or mechanical parts) other than the chips CP1 to CP4 may be mounted to the substrate BRD. Also, for example, the respective chips CP1 to CP4 may have a plurality of arithmetic units each including an arithmetic element and a memory. The arithmetic element may be a multiply-accumulator, an inner product operator or the like.

The chips CP1 and CP3 are located on a first diagonal line D1, which is one diagonal line of the rectangular substrate BRD including placement areas of the chips CP1 to CP4, and the chips CP2 and CP4 are located on a second diagonal line D2, which is the other diagonal line of the substrate BRD. In the following, the first diagonal line D1 and the second diagonal line D2 may be simply referred to as the diagonal line D1 and the diagonal line D2, respectively. Also, if the diagonal lines D1 and D2 are described without distinction, they may be referred to as the diagonal lines D. In this embodiment, an outer shape of the substrate BRD with respect to the planer view is the same as a shape of the placement areas of the chips CP1 to CP4. In other words, the diagonal lines of the substrate BRD are the same as the diagonal lines D1 and D2 of the placement areas of the chips CP1 to CP4. Also, in the present specification, the placement of the chips CPs on the diagonal lines D of the substrate BRD means that the placed chips CPs overlap with the diagonal lines D of the substrate BRD with respect to the planar view, and corners of the chips CPs may not be necessarily located on the diagonal lines D of the substrate BRD.

The chip CP1 has an internal circuit INT1 and a transferring circuit TR1, and the chip CP2 has an internal circuit INT2 and a transferring circuit TR2. The chip CP3 has an internal circuit INT3 and a transferring circuit TR3, and the chip CP4 has an internal circuit INT4 and a transferring circuit TR4. In the following, each of the internal circuits INT1 to INT4 may be referred to as an internal circuit INT, and each of the transferring circuits TR1 to TR4 may be referred to as a transferring circuit TR.

The internal circuit INT1 of the first chip CP1 and the internal circuit INT2 of the second chip CP2, respective edges of which adjacently face each other, are coupled to each other via signal lines S12 and S21 provided in the substrate BRD. The first chip CP1 has an input and output circuit IO12 for inputting and outputting signals such as data to the signal lines S12 and S21, and the second chip CP2 has an input and output circuit IO21 for inputting and outputting signals such as data to the signal lines S12 and S21.

The internal circuit INT2 of the second chip CP2 and the internal circuit INT3 of the third chip CP3, respective edges of which adjacently face each other, are coupled to each other via signal lines S23 and S32 provided in the substrate BRD. The second chip CP2 has an input and output circuit IO23 for inputting and outputting signals such as data to the signal lines S23 and S32, and the third chip CP3 has an input and output circuit IO32 for inputting and outputting signals such as data to the signal lines S23 and S32.

The internal circuit INT3 of the third chip CP3 and the internal circuit INT4 of the fourth chip CP4, respective edges of which adjacently face each other, are coupled to each other via signal lines S34 and S43 provided in the substrate BRD. The third chip CP3 has an input and output circuit IO34 for inputting and outputting signals such as data to the signal lines S34 and S43, and the fourth chip CP4 has an input and output circuit IO43 for inputting and outputting signals such as data to the signal lines S34 and S43.

The internal circuit INT4 of the fourth chip CP4 and the internal circuit INT1 of the first chip CP1, respective edges of which adjacently face each other, are coupled to each other via signal lines S41 and S14 provided in the substrate BRD. The fourth chip CP4 has an input and output circuit IO41 for inputting and outputting signals such as data to the signal lines S41 and S14, and the first chip CP1 has an input and output circuit IO14 for inputting and outputting signals such as data to the signal lines S41 and S14. Each of the signal lines S12, S21, S23, S32, S34, S43, S41 and S14 is coupled to bumps BPs (FIG. 3) provided in the respective chips CPs. In the following, if the various signal lines are described without distinction, they may be referred to as signal lines S.

On the other hand, the first chip CP1 and the third chip CP3, which are located on the first diagonal line D1 of the substrate BRD and have respective corners facing each other, are coupled to each other via signal lines S13a provided in the substrate BRD, the first transferring circuit TR2 of the second chip CP2 and signal lines S13b provided in the substrate BRD. Also, the third chip CP3 and the first chip CP1 are coupled to each other via signal lines S31a provided in the substrate BRD, the second transferring circuit TR4 of the fourth chip CP4 and signal lines S31b provided in the substrate BRD.

The second chip CP2 and the fourth chip CP4, which are located on the second diagonal line D2 of the substrate BRD and have respective corners facing each other, are coupled to each other via signal lines S24a provided in the substrate BRD, the third transferring circuit TR3 of the third chip CP3 and signal lines S24b provided in the substrate BRD. Also, the fourth chip CP4 and the second chip CP2 are coupled to each other via signal lines S42a provided in the substrate BRD, the fourth transferring circuit TR1 of the first chip CP1 and signal lines S42b provided in the substrate BRD. In the following, the first transferring circuit TR2, the second transferring circuit TR4, the third transferring circuit TR3 and the fourth transferring circuit TR1 may be simply referred to as the TR2, the TR4, the TR3 and the TR1, respectively.

In the above-stated arrangement, the semiconductor device SEM1 can exchange signals such as data among the four chips CP1 to CP4 each other. As a result, if operations are performed with a plurality of arithmetic units mounted to the respective chips CP1 to CP4, for example, data and operation results for use in the arithmetic units can be input and output to and from all the other chips CPs. Accordingly, the semiconductor device SEM1 is suitable for machine learning, particularly deep learning using a neural network, where large numbers of data and parameters are used for data processing.

The arrows attached to the respective signal lines S indicate the transmission direction of signals transmitted in the signal lines S, and the symbol "/" attached to the respective signal lines S indicates that the signal lines S are composed of multiple bits. Signals S transmitted in the signal lines S include data, clocks and so on. The number of data bits may range, but not limited to, from tens of bits to about 100 bits.

The transferring circuit TR1 transfers the outgoing signal S42a from the internal circuit INT4 of the chip CP4 to the internal circuit INT2 of the chip CP2 as the signal S42b. The transferring circuit TR2 transfers the outgoing signal S13a from the internal circuit INT1 of the chip CP1 to the internal circuit INT3 of the chip CP3 as the signal S13b. The transferring circuit TR3 transfers the outgoing signal S24a from the internal circuit INT2 of the chip CP2 to the internal circuit INT4 of the chip CP4 as the signal S24b. The transferring circuit TR4 transfers the outgoing signal S31a from the internal circuit INT3 of the chip CP3 to the internal circuit INT1 of the chip CP1 as the signal S31b.

Then, a data transferring method for transferring data from one of the two chips located on one of the diagonal lines D to the other via the transferring circuit TR provided in one of the two chips that are not located on the one of the diagonal lines D is achieved in placement areas of the four chips CP1 to CP4.

For example, the signal lines (wires) S13a can be provided between mutually facing edges of the chips CP1 and CP2. Likewise, the other signal lines S24a, S31a, S42a, S42b, S13b, S24b and S31b can be also provided between mutually facing edges of the chips. Accordingly, the increasing number of signal lines S13a, S24a, S31a, S42a, S42b, S13b, S24b and S31b can be wired, compared to other cases where corners of the two chips located on the diagonal lines D are coupled to each other with slanting wires.

Also, for example, the lengths of multiple signal lines S13a wired between mutually facing edges of the chips CP1 and CP2 can be aligned. By making the lengths of the signal lines S13a uniform, skew of signals transmitted via the signal lines S13a can be reduced, and accordingly the timing design can be facilitated, which can improve the performance of the semiconductor device SEM1. The other signals S24a, S31a, S42a, S42b, S13b, S24b and S31b are also analogous.

Also, the signal lines S13a, S24a, S31a, S42a, S42b, S13b, S24b and S31b can be wired in accordance with a rule similar to a wiring rule applied for the signal lines S12 and S21 for coupling between the chips CP1 and CP2. Accordingly, the layout for the signal lines S13a, S24a, S31a, S42a, S42b, S13b, S24b and S31b can be more easily designed.

As illustrated in FIG. 1, in this embodiment, the transmission path of signals between the two chips located on the diagonal line D is clockwise, and the input path and the output path differ from each other. Accordingly, the single transferring circuit TR (any of TR1 to TR4) can be provided in each of the chips CPs, and the four chips CPs can be designed in accordance with common layout data. As a result, the chip cost can be reduced, and the cost of the semiconductor device SEM1 can be lowered. However, the present disclosure is not limited to the above, and the transmission path of signals between the two chips CPs located on the diagonal line may be counterclockwise.

For example, the transferring circuit TR2 outputs data included in the signal S13a received from the chip CP1 to only the internal circuit INT3 of the chip CP3 and does not output the data to the internal circuit INT2 of its own chip CP2. In other words, the internal circuit INT2 does not use the data included in the signal S13a transferred between the chips CP1 and CP3 for data processing or the like, and the transferring circuit TR2 serves as a relay circuit for relaying the data included in the signals S13a and S13b between the chips CP1 and CP3. Note that the internal circuit INT2 may monitor the signal S13a transferred in the transferring circuit TR2.

Figure 2:
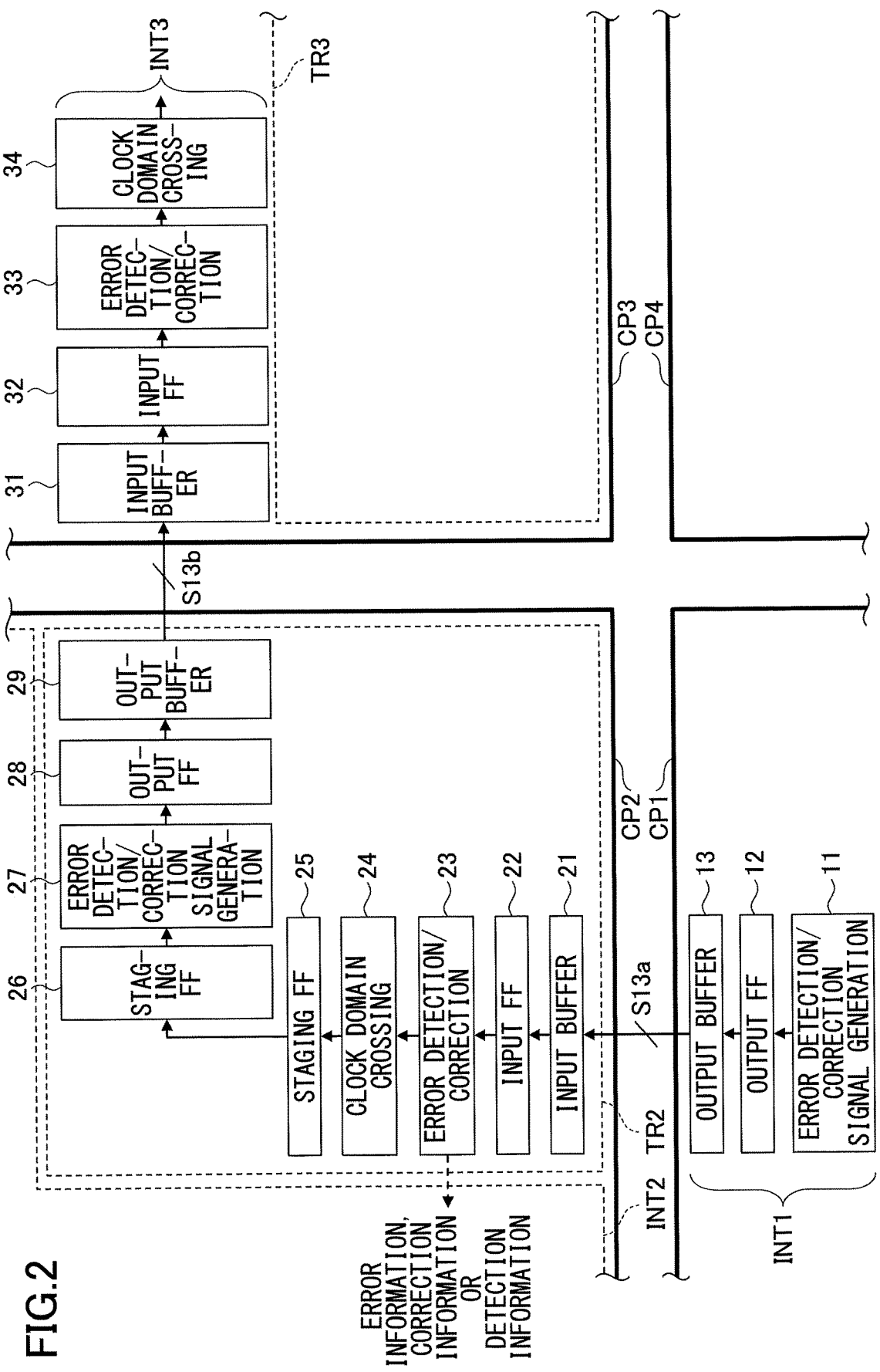
FIG. 2 is a block diagram for illustrating one exemplary transferring circuit in FIG. 1 and exemplary circuits around the transferring circuit according to one embodiment of the present disclosure.
Figure 3:
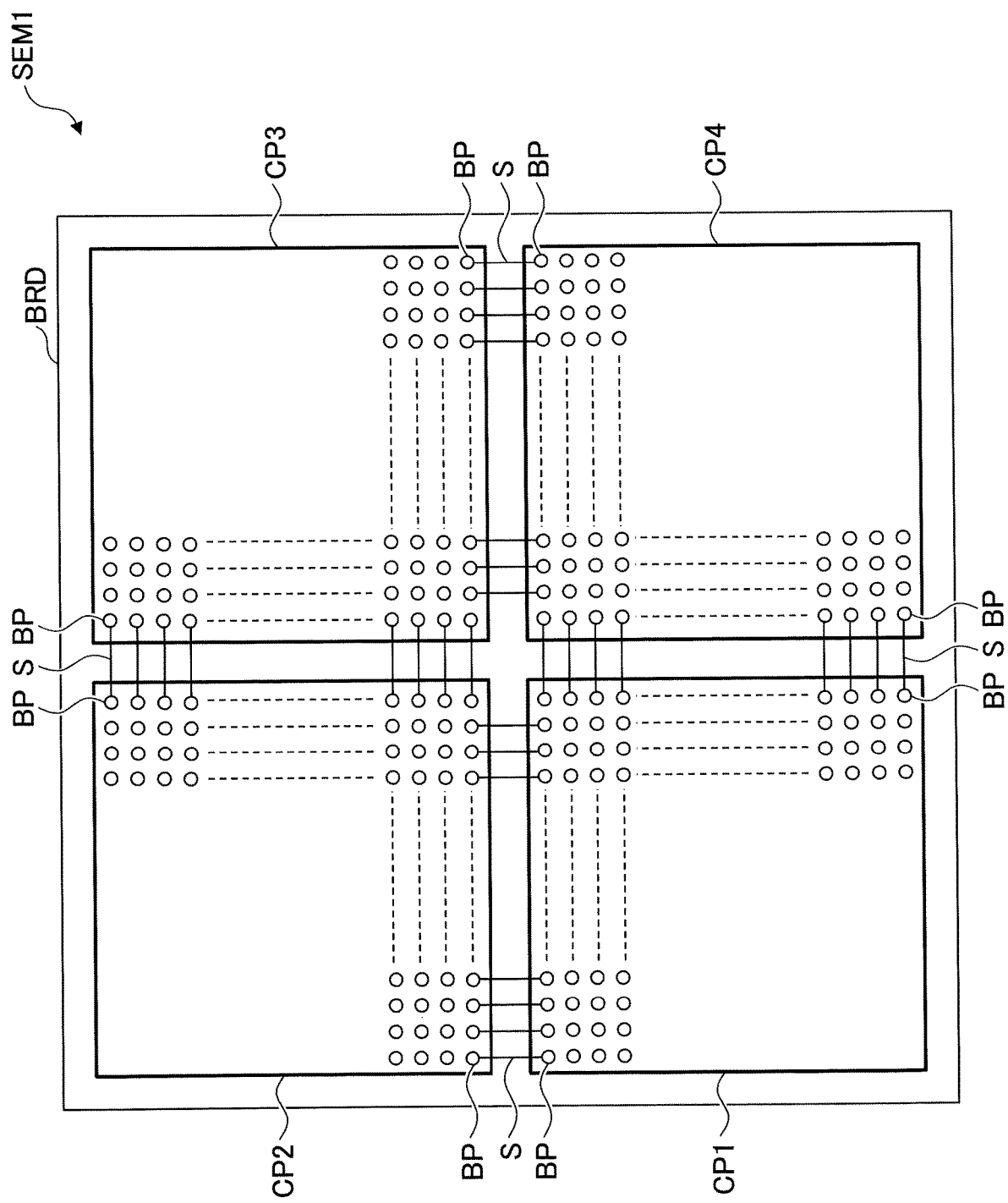
FIG. 3 is an explanatory diagram for schematically illustrating exemplary interconnections with signal lines between bumps provided in chips in FIG. 1.

It is preferable that the transferring circuit TR in each chip CP be placed at the center side of the placement areas (at the center side of the substrate BRD in the embodiments as illustrated in FIGS. 1 to 3). As a result, compared to the case where the transferring circuit TR is placed at the peripheral side of the placement areas (at the peripheral side of the substrate BRD), the transmission path of signals between the chips CP1 and CP3 and the transmission path of signals between the chips CP2 and CP4 can be shortened, which can reduce the transmission time of signals.

Note that the substrate BRD may be a silicon interposer. The semiconductor device SEM1 may be formed by packaging the substrate BRD having the chips CP1 to CP4 mounted, as described in detail below. Also, the chips CP1 to CP4 may be provided in a state where they are sealed and packaged with a resin or the like. In addition, the semiconductor device SEM1 may be coupled to a printed circuit board having other semiconductor parts or the like mounted via bumps provided on the front surface of the substrate BRD having the chips CP1 to CP4 mounted and the opposite rear surface.

If the transmission path of signals between the two chips located on the diagonal line D is made bi-directional, the two transferring circuits TR1 and TR3 for transferring signals exchanged between the chips CP2 and CP4 may be provided in only one of the chips CP1 and CP3. Likewise, the two transferring circuits TR2 and TR4 for transferring signals exchanged between the chips CP1 and CP3 may be provided in only one of the chips CP2 and CP4.

For example, if the transferring circuits TR1 and TR3 are provided in only the chip CP1 and the transferring circuits TR2 and TR4 are provided in only the chip CP2, the layout for the chips CP1 and CP2 and the layout for the chips CP3 and CP4 must be designed separately. In this case, an area including densely wired signal lines S and an area of sparsely wired signal lines S may arise in the substrate BRD, and accordingly it would be difficult to design the wiring layout.

Furthermore, the internal circuits INT1 and INT2 of the chips CP1 and CP2 have a smaller spatial area than the internal circuits INT3 and INT4 of the chips CP3 and CP4 do. Accordingly, if the chips CP1 to CP4 are designed to have the same chip size, an unavailable area without any circuit may arise in the internal circuits INT3 and INT4 of the chips CP3 and CP4. Furthermore, if the chips CP3 and CP4 are designed to have a smaller chip size than the chips CP1 and CP2 to decrease such an unavailable area, the two different types of chips must be designed.

FIG. 2 is a block diagram for illustrating the transferring circuit TR2 in FIG. 1 and its adjacent circuits. The other transferring circuits TR1, TR3 and TR4 and their own adjacent circuits also may have arrangements similar to that in FIG. 2.

The transferring circuit TR2 has an input buffer 21, an input flip flop (FF) 22, an error detection/correction circuit 23, a clock domain crossing circuit 24, a staging FF 25, a FF 26, an error detection/correction signal generation circuit 27, an output FF 28 and an output buffer 29. Note that the number of staging FFs inserted in the transferring circuit TR2 may be determined depending on the length of the transmission path of signals and the clock frequency and is not limited to the number as illustrated in FIG. 2.

The input buffer 21 receives the signal S13a of multiple bits from the chip CP1 via the signal line S13a and outputs the received signal S13a to the input FF 22. The input FF 22 fetches the signal S13a in synchronization with a (not shown) clock and outputs the fetched signal S13a to the error detection/correction circuit 23. Note that the clock for use in the input FF 22 is a clock for use in the chip CP1 included in the outgoing signal S13a from the chip CP1.

The error detection/correction circuit 23 uses error detection/correction signals included in the signal S13a of multiple bits to detect or correct an error in data included in the signal S13a and if the correction is made, outputs the error corrected data to the clock domain crossing circuit 24. In this manner, even if the error occurs in the data received from the chip CP1 via the signal line S13a, the error corrected data can be transferred to the chip CP3.

Note that if the error detection/correction circuit 23 detects some errors that cannot be corrected, the error detection/correction circuit 23 may generate error information indicative of detection of the errors that cannot be corrected. In addition, if the error detection/correction circuit 23 has corrected an error in data, the error detection/correction circuit 23 may generate correction information indicating that the error has been corrected. Also, in this case, the error information or the correction information may be output to the internal circuit INT2 of the chip CP2. Also, if the error detection/correction circuit 23 generates the error information or the correction information, the internal circuit INT2 of the chip CP2 may store the error information or the correction information and use the stored error or correction information to perform information processing such as calculation of an error correction rate.

Also, the error detection/correction circuit 23 may perform only the error detection on data. In this case, the error detection/correction signal generation circuit 11 of the internal circuit INT1 may generate signals for performing only the error detection such as parity bits. Furthermore, if the error detection/correction circuit 23 detects an error in data, the error detection/correction circuit 23 may generate detection information indicating that the error has been detected and output the generated detection information to the internal circuit INT2. If the error detection/correction circuit 23 generates the detection information, the internal circuit INT2 may store the detection information and use the stored detection information to perform information processing such as calculation of an error detection rate.

The error information, the correction information or the detection information that is generated by the error detection/correction circuit 23 and is output to the internal circuit INT2 or some information that is generated based on the error information, the correction information or the detection information may be output to the internal circuit INT3 of the chip CP3 via the internal circuit INT2. In this case, for example, the error information, the correction information or the detection information or the information generated based on the error information, the correction information or the detection information may be transmitted to the internal circuit INT3 via the input and output circuit IO23 of the internal circuit INT2, the signal line S23 and the input and output circuit IO32 of the internal circuit INT3 as illustrated in FIG. 1. In this manner, signals other than the data, the error detection/correction signal and the clock can be prevented from being transmitted in the signal line S13b, and the number of signal lines S13b can be minimized. In other words, the signal lines S13b can be used for only transferring the data from the chip CP1 to the chip CP3.

The clock domain crossing circuit 24 converts the data included in the signal S13a synchronized with the clock of the chip CP1 into the data synchronized with the clock of the chip CP2 and outputs the converted data to the staging FF 25. For example, an input asynchronous FIFO (First-In First-Out) may be used as the clock domain crossing circuit 24. Note that the coupling order of the error detection/correction circuit 23 and the clock domain crossing circuit 24 may be reversed. In other words, the error detection/correction circuit 23 may perform error detection on the data synchronized by the clock domain crossing circuit 24 with the clock of the chip CP2 and arbitrarily correct detected errors.

The staging FF 25 and the FF 26 are exemplary relay circuits for relaying data sequentially. Note that if the transferring distance of signals in the transferring circuit TR2 is short, the transferring circuit TR2 does not need to have the staging FF 25 and the FF 26. In this case, outgoing data from the clock domain crossing circuit 24 may be output to the error detection/correction signal generation circuit 27 directly.

The error detection/correction signal generation circuit 27 generates an error detection/correction signal for correcting an error in data of multiple bits and outputs the generated error detection/correction signal as well as the data to the output FF 28. For example, the error detection/correction signal may be an ECC (Error Correction Code) or the like. The output FF 28 outputs the data, the error detection/correction signal and the clock to the output buffer 29. The output buffer 29 outputs the data, the error detection/correction signal and the clock as the signal S13b to the chip CP3.

In one embodiment, the internal circuit INT1 of the chip CP1 for outputting the signal S13a has an error detection/correction signal generation circuit 11, an output FF 12 and an output buffer 13. The error detection/correction signal generation circuit 11, the output FF 12 and the output buffer 13 have functionalities similar to the error detection/correction signal generation circuit 27, the output FF 28 and the output buffer 29, respectively, in the transferring circuit TR2.

The internal circuit INT3 of the chip CP3 has an input buffer 31, an input FF 32, an error detection/correction circuit 33 and a clock domain crossing circuit 34. The input buffer 31, the input FF 32, the error detection/correction circuit 33 and the clock domain crossing circuit 34 have functionalities similar to the input buffer 21, the input FF 22, the error detection/correction circuit 28 and the clock domain crossing circuit 24, respectively, in the transferring circuit TR2.

The input buffer 31 receives the signal S13b of multiple bits transferred from the chip CP1 via the transferring circuit TR2 of the chip CP2 and outputs the received signal S13b to the input FF 32. The input FF 32 fetches the signal S13b in synchronization with the clock of the chip CP2 included in the signal S13b and outputs the fetched signal S13b to the error detection/correction circuit 33.

The error detection/correction circuit 33 uses an error detection/correction signal included in the signal S13b to detect or correct an error in data included in the signal S13b and if the error has been corrected, outputs the error corrected data to the clock domain crossing circuit 34. The clock domain crossing circuit 34 converts the data included in the signal S13b synchronized with the clock of the chip CP2 into data synchronized with the clock of the chip CP3. Then, the internal circuit INT3 uses the signal S13b transferred from the chip CP1 via the transferring circuit TR2 of the chip CP2 to perform data processing or the like. If the processed data must be returned to the chip CP1, the internal circuit INT3 transfers the data to the chip CP1 via the transferring circuit TR4 of the chip CP4 as illustrated in FIG. 1. Also, the error detection/correction circuit 33 may perform only the error detection. In this case, the error detection/correction signal generation circuit 27 of the transferring circuit TR2 may generate signals for performing only the error detection such as parity bits.

Note that the coupling order of the error detection/correction circuit 33 and the clock domain crossing circuit 34 may be reversed. In other words, the error detection/correction circuit 33 may perform the error detection on data synchronized by the clock domain crossing circuit 34 with the clock of the chip CP3 and arbitrarily correct the detected error. Also, the transferring circuit TR2 may not have the error detection/correction circuit 23 and the error detection/correction signal generation circuit 27. Also, the transferring circuit TR1 may not have the error detection/correction signal generation circuit 11. Also, the transferring circuit TR3 may not have the error detection/correction circuit 33.

FIG. 3 is an explanatory view for schematically illustrating one exemplary mutual coupling between bumps BPs provided in the chips CP1 to CP4 in FIG. 1 via signal lines S (wires). The signal lines S are formed in a wiring layer of the substrate BRD such as a silicon interposer, for example. The signal lines S coupled to the bumps BPs as illustrated in FIG. 3 are wired in accordance with the same wiring rule without distinction based on destinations of signals, for example. Accordingly, as stated in conjunction with FIG. 1, the lengths of the multiple signal lines S can be made more uniform, and skew of the signals S can be reduced. In FIG. 3, for ease in description, the bumps BPs on the respective chips CPs are illustrated, and only the facing bumps BP are coupled to each other via the signal lines S. However, the bumps BPs are actually located between the respective chips CPs and the substrate BRD. Also, in order to make the lengths of the signal lines S uniform, the bumps BPs aligned along the right edge of the chip CP2 are coupled to the bumps BPs located at the deeper side than the bumps BPs aligned along the left edge of the chip CP3 via the signal lines S, for example.

Figure 4:
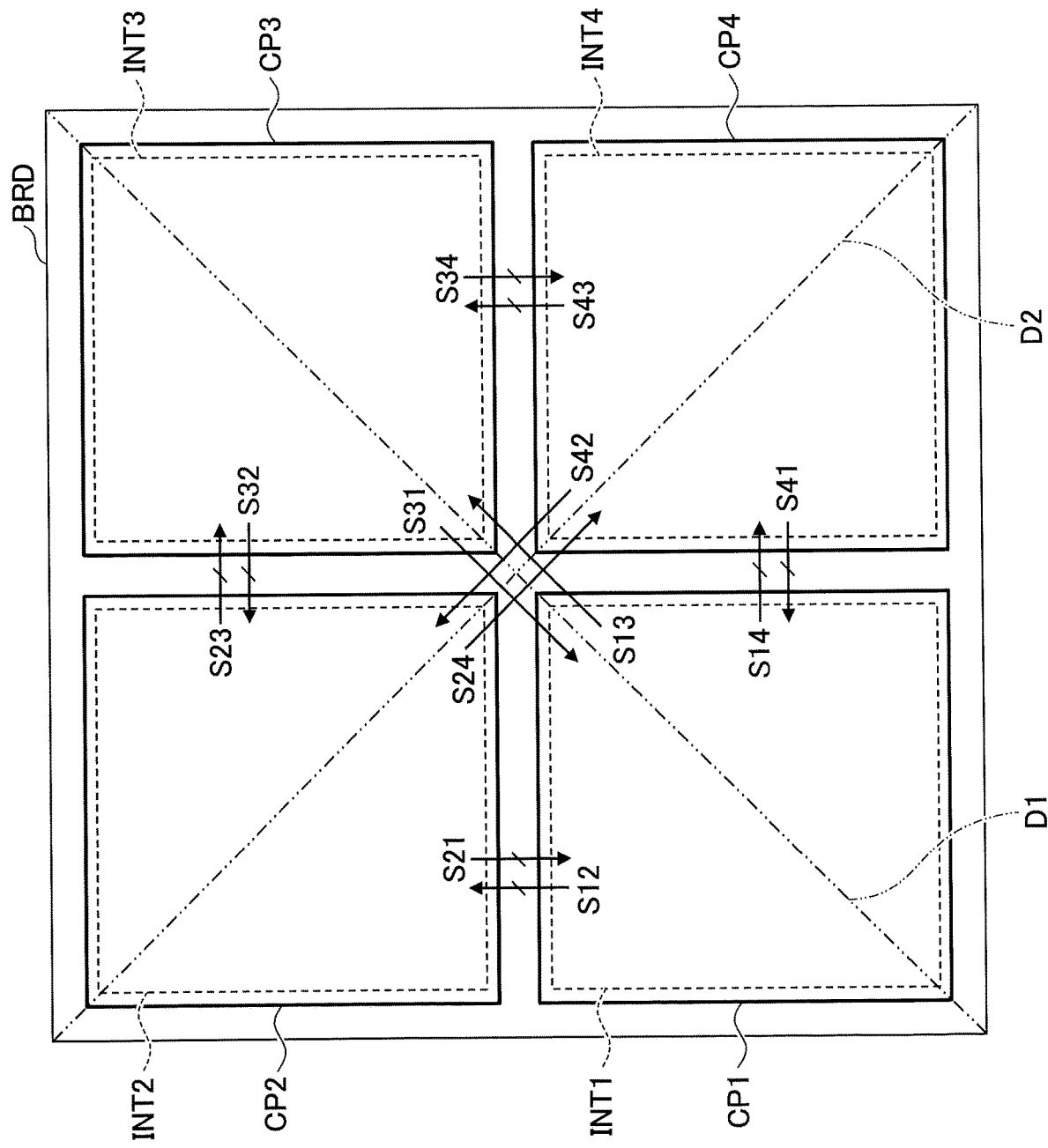
FIG. 4 is a block diagram for illustrating exemplary connections with signal lines between two diagonally placed chips without provision of the transferring circuit in FIG. 1 to the respective chips as a comparison example.

FIG. 4 is a block diagram for illustrating one exemplary coupling between the two chips CP1 and CP3 (or CP2 and CP4) located on the diagonal line D1 (or D2) via the signal lines S13 and S31 (or S24 and S42) without providing the transferring circuits TRs to the respective chips CPs for comparison to the embodiment as illustrated in FIG. 1.

In this case, the bumps (not shown) provided in corner areas of the chips CP1 to CP4 near an intersection point of the diagonal lines D1 and D2 would be used for coupling of signal lines for both inputs and outputs by means of slanting wires. Furthermore, the signal lines S13 and S31 must be crossed with the signal lines S24 and S42. Accordingly, if the large number of the signal lines S13, S31, S24 and S42 are provided, there are some cases of difficulty of wiring. Also, if the increasing number of wiring layers in the substrate BRD such as a silicon interposer are used to implement the wiring, the cost and the latency of signals may increase. In addition, if the lengths of the signal lines S13 and S31 (or S24 and S42) are not uniform, there may arise skew in the signals. In contrast, the embodiment as illustrated in FIG. 3 can reduce the above problems, compared to that in FIG. 1.

In the embodiments as illustrated in FIGS. 1 to 3, data can be exchanged between two chips CPs located on the diagonal line D via the transferring circuits TRs provided in two chips CPs that are not located on the diagonal line D. Since the signal lines S coupled to the transferring circuit TRs are provided along mutually facing edges of the two chips CPs located on the diagonal line D, the increasing number of signal lines S can be wired, compared to the case where slanting wires provided in almost parallel to the diagonal line D are used for coupling. Also, the two chips CPs placed adjacently via mutually facing edges can input and output data via the input and output circuits IOs each other. As a result, an equal informational amount of data can be exchanged among the four chips CP1 to CP4, which can lead to satisfactory mutual communication among the chips CP1 to CP4.

Since such an equal informational amount of data can be exchanged among the four chips CP1 to CP4, the semiconductor device SEM1 can be implemented by dividing functionalities served by a single chip into the four chips CP1 to CP4. In this case, compared to the case of the functionalities being implemented with the single chip, it can be expected to improve a yield indicative of a non-defective rate of the chips CPs. The improved yield can reduce the chip cost, which can lower the cost of the semiconductor device SEM1.

The lengths of the multiple signal lines S for transferring data between the two chips CPs located on the diagonal line D can be made more uniform, which can reduce the skew of data transmitted via the signal lines S. As a result, the timing design can be facilitated, and the performance of the semiconductor device SEM1 can be enhanced.

The transferring circuit TRs are placed in the chips CPs at the center side (at the center side of the placement areas of the chips) of the substrate BRD, and accordingly the transmission path of signals between the chips CPs can be shortened, compared to the case where the transferring circuits TRs are placed at the peripheral side (at the peripheral side of the placement areas of the chips CPs) of the substrate BRD. Through provision of the single transferring circuit TR to the respective chips CPs, the four chips CPs can be designed in accordance with common layout data. As a result, the chip cost can be reduced, and the cost of the semiconductor device SEM1 can be lowered.

Even if an error occurs in data received from one of the chips CPs via the signal lines S, each transferring circuit TR can use the error detection/correction circuit 23 to detect the error or transfer the error corrected data to the other of the chips CPs. Also, each transferring circuit TR uses the error detection/correction signal generation circuit 27 to generate an error detection/correction signal for detecting or correcting an error in data transferred to the other chip CP. As a result, even if the outgoing data from the transferring circuit TR includes an error, the error detection/correction circuit of the other chip CP can perform error detection or correction on the received data. Accordingly, even in the case where data transmission between the two chips CPs located on the diagonal line D is performed via other chips CPs, reduction in data reliability can be mitigated.

Figure 5:
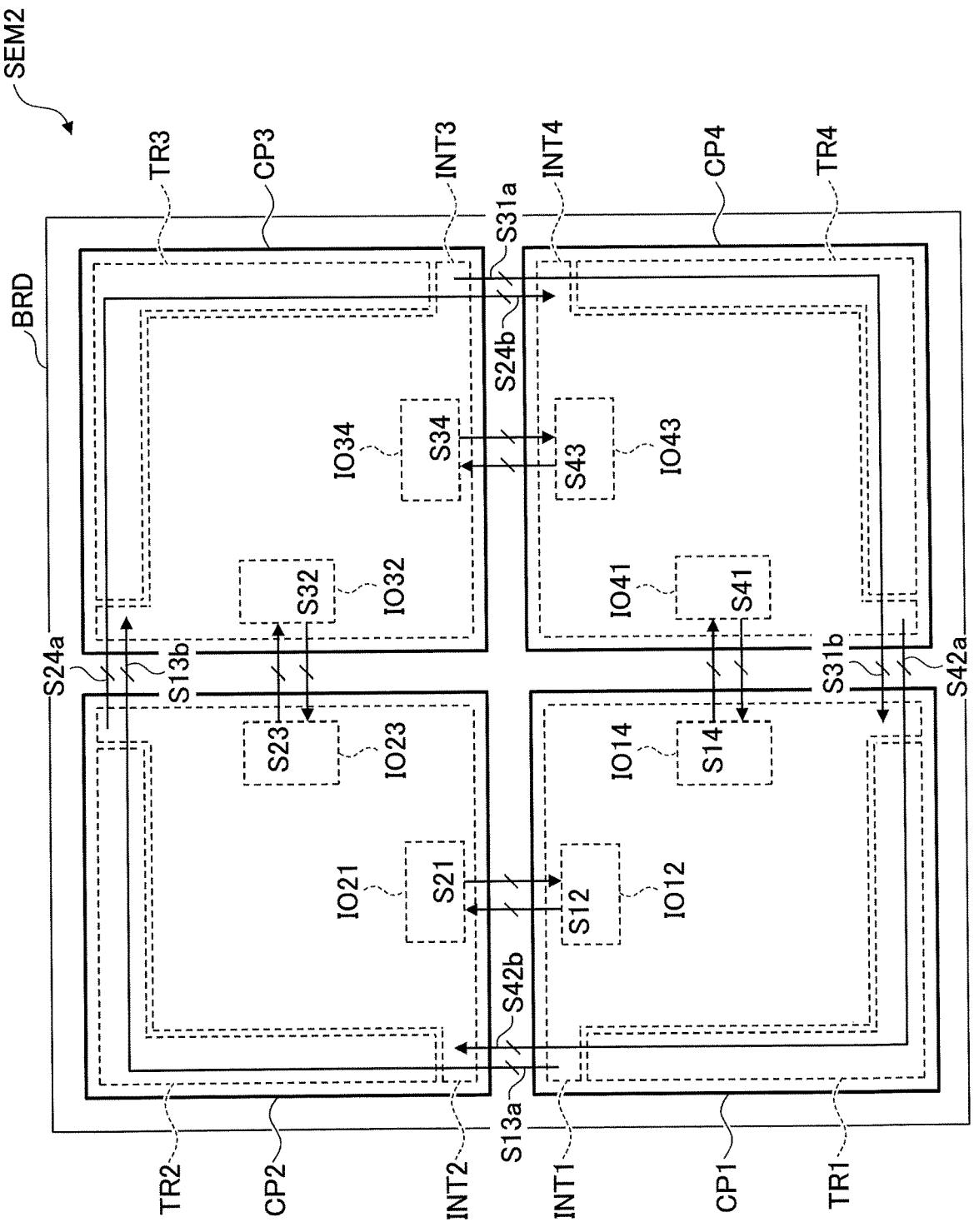
FIG. 5 is a block diagram for illustrating a semiconductor device according to another embodiment of the present disclosure.

FIG. 5 is a block diagram for illustrating one exemplary semiconductor device according to another embodiment of the present disclosure. The same symbols are attached to elements similar to those in FIG. 1, and descriptions thereof are omitted. A semiconductor device SEM2 as illustrated in FIG. 5 has the same arrangement as the semiconductor device SEM1 in FIG. 1 with the exception of provision of the transferring circuits TRs (TR1 to TR4) at the outer circumferential side of the placement areas of the respective chips CPs (CP1 to CP4).

In this embodiment, the transmission distance of signals S in the respective transferring circuits TRs is long, and thus a larger number of staging FFs (not shown) than the embodiment in FIG. 2 may be provided to the respective transferring circuits TRs. The respective transferring circuits TRs have the same arrangement as the transferring circuit TR2 as illustrated in FIG. 2 with the exception of the larger number of staging FFs. Note that the position of the transferring circuit TR provided in the respective chips CPs is not limited to the embodiment as illustrated in FIG. 5. For example, the transferring circuit TR may be placed at the center side of the respective chips CPs. Also, the transferring circuit TR may be distributed over several areas in the respective chips CPs. The semiconductor device SEM2 as illustrated in FIG. 5 can achieve advantages similar to the semiconductor device SEM1 in FIG. 1.

Figure 6:
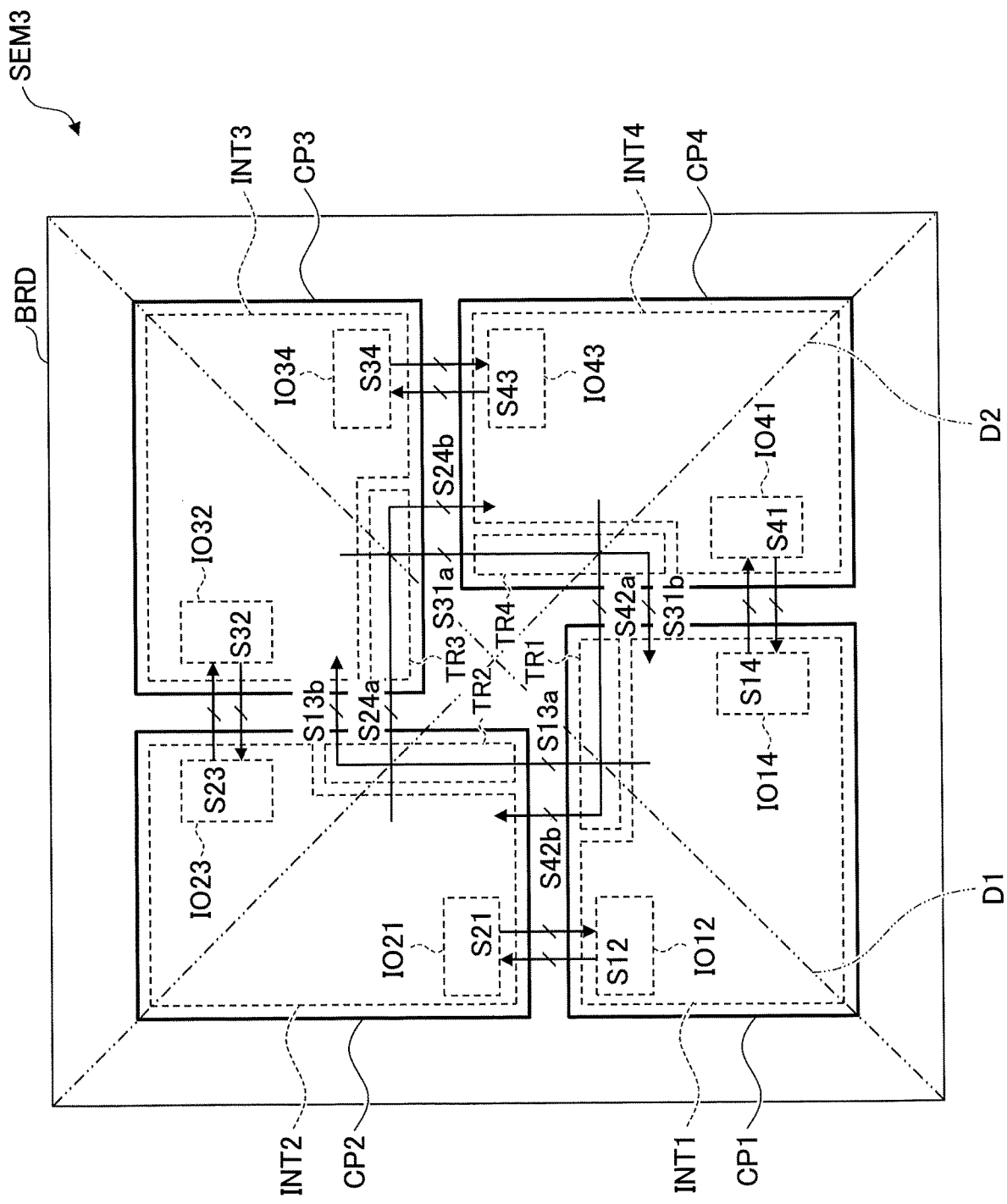
FIG. 6 is a block diagram for illustrating a semiconductor device according to another embodiment of the present disclosure.

FIG. 6 is a block diagram for illustrating one exemplary semiconductor device according to another embodiment of the present disclosure. The same symbols are attached to elements similar to those in FIG. 1, and descriptions thereof are omitted. A semiconductor device SEM3 as illustrated in FIG. 6 has four chips CPs (CP1 to CP4) on the substrate BRD, each of which has a rectangular shape with long edges and short edges. The respective chips CPs have the transferring circuits TRs (TR1 to TR4) similar to those in FIGS. 1 and 2, and signals are relayed between the two chips CPs located on the diagonal line D1 (or D2).

An unoccupied area, where the chips CP1 to CP4 are not placed, is provided at the center of the substrate BRD (at the center side of the placement areas of the chips CPs) such that the shape of an area surrounded with the placement areas of the chips CP1 to CP4 includes no protrusion, that is, such that the outer circumferential shape of the placement areas can be almost rectangular. In other words, respective edges of the rectangular placement areas of the chips CP1 to CP4 are defined of one long edge and one short edge of the respective chips CPs. Also, one of the long edges of each chip CP faces one of the short edges of an adjacent chip CP, and one of the short edges of each chip CP faces one of the long edges of an adjacent chip CP. The long edges of the two chips CPs located on the diagonal line D1 (or D2) faces each other via the unoccupied area. Also, the unoccupied area is surrounded with the four chips CP1 to CP4.

The semiconductor device SEM3 excluding the above has the same arrangement as the semiconductor device SEM1 in FIG. 1. Note that the position of the transferring circuits TRs provided in the respective chips CPs is not limited to the embodiment as illustrated in FIG. 6. Also, the transferring circuits TRs may be distributed over several areas of the respective chips CPs.

Figure 7:
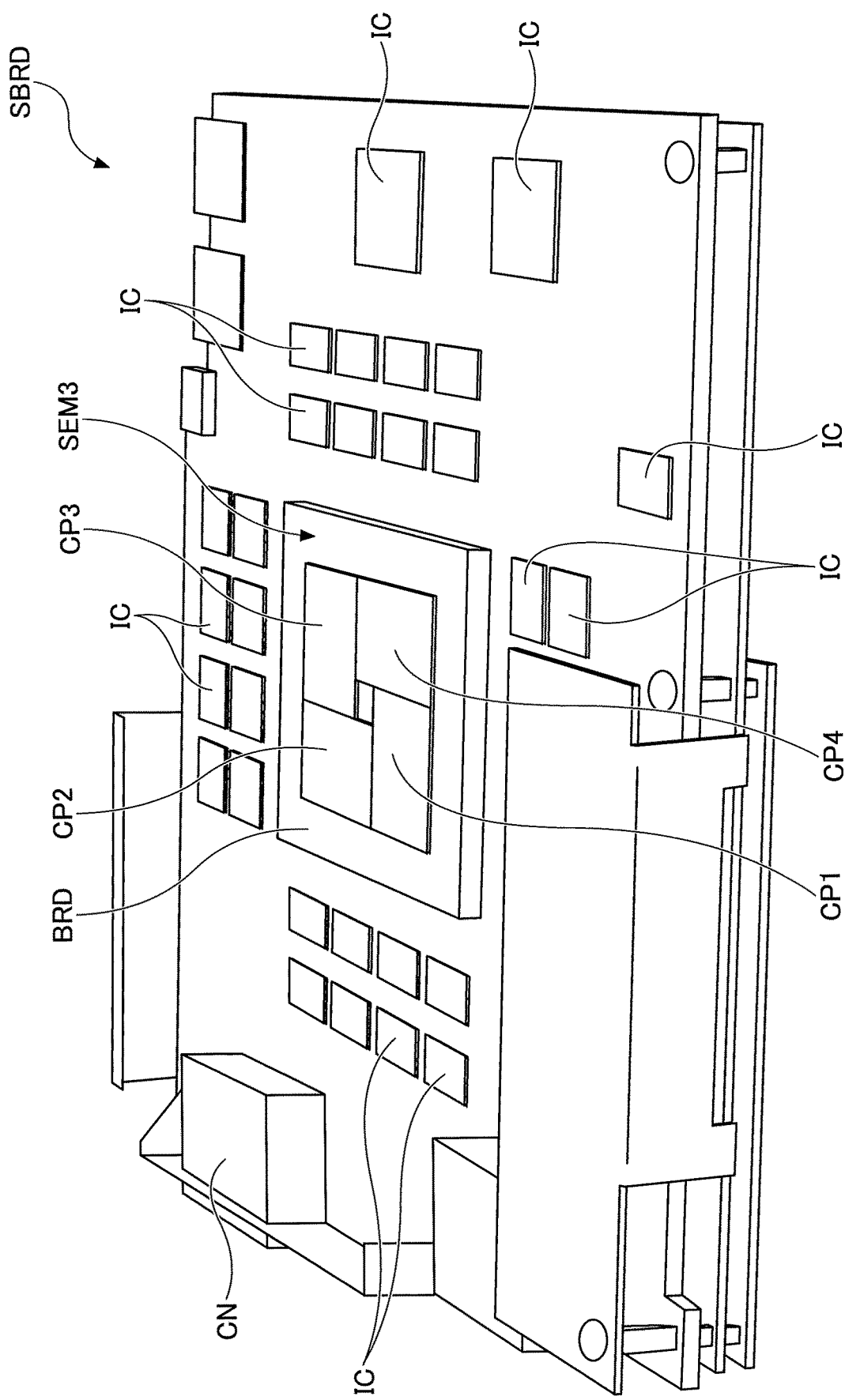
FIG. 7 is a cross-sectional view for illustrating one exemplary system substrate onto which the semiconductor device in FIG. 6 is mounted.

FIG. 7 is a cross-sectional view for illustrating one exemplary system substrate SBRD having the semiconductor device SEM3 in FIG. 6. In FIG. 7, the semiconductor device SEM3 together with other electronic parts ICs and a connector CN is mounted on the system substrate SBRD. For example, the system substrate SBRD is a printed circuit board. The system substrate SBRD may be coupled to a back panel provided in a rack (not shown) or the like via the connector CN. Also, a cluster may be formed by coupling the multiple system substrates SBRDs to the rack or the like.

Note that the semiconductor device SEM1 in FIG. 1, the semiconductor device SEM2 in FIG. 5 and a semiconductor device SEM4 as stated below in conjunction with FIG. 8 may be also mounted to the system substrate SBRD similar to FIG. 7.

According to the semiconductor device SEM3 of the present embodiment, advantages similar to the semiconductor device SEM1 in FIG. 1 can be obtained.

Figure 8:
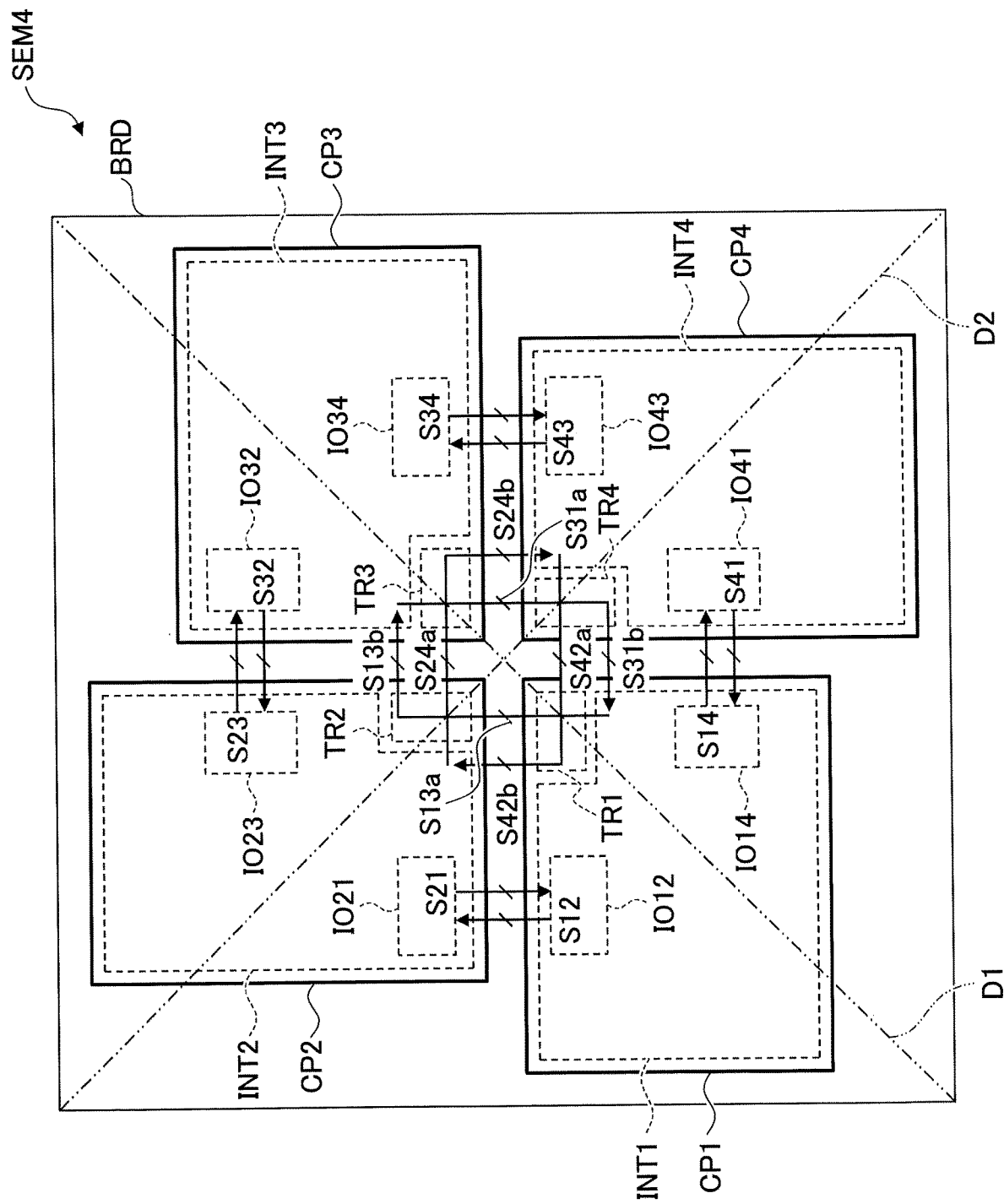
FIG. 8 is a block diagram for illustrating one exemplary semiconductor device according to another embodiment of the present disclosure.

FIG. 8 is a block diagram for illustrating one exemplary semiconductor device according to another embodiment of the present disclosure. The same symbols are attached to elements similar to those in FIGS. 1 and 6, and descriptions thereof are omitted. A semiconductor device SEM4 as illustrated in FIG. 8 has four rectangular chips CPs (CP1 to CP4) mounted on the substrate BRD. The respective chips CPs have transferring circuits TRs (TR1 to TR4) similar to those in FIGS. 1 and 2, and the respective transferring circuits TRs relay signals between the two chips located on the diagonal line D1 (or D2).

In this embodiment, similar to the embodiment in FIG. 1, the transferring circuits TRs are provided at the center side of the substrate BRD having placement areas of the chips CP1 to CP4 in order to minimize the size of the transferring circuits TRs and the delay of signals S transmitted via the transferring circuits TRs. As a result, the respective chips CP1 to CP4 are mounted on the substrate BRD such that one corner of each of the chips CP1 to CP4 can be placed near an intersection point of the diagonal lines D1 and D2. According to this arrangement, outer edges of the respective chips CP1 to CP4 are not linearly aligned, and an area surrounded with the placement areas of the chips CP1 to CP4 has protrusions. Accordingly, the size of the substrate BRD can be determined depending on the protrusions. Also, as the unoccupied area surrounded with the placement areas is smaller, the spatial area in the substrate BRD occupied by the chips CP1 to CP4 can be smaller. As a result, the spatial area in the substrate BRD available for installation of other electronic parts can be enlarged. The semiconductor device SEM4 has the same arrangement as the semiconductor device SEM1 in FIGS. 1 and 6 with the exception of the above. The semiconductor device SEM4 of the present embodiment can achieve advantages similar to the semiconductor device SEM1 in FIG. 1.

In the embodiments as illustrated in FIGS. 1, 5, 6 and 8, the transferring circuits TRs are provided in the respective chips CPs. However, if data need to be exchanged between the chips CP2 and CP4 but no data need to be exchanged between the chips CP1 and CP3, the transferring circuit TRs may be provided in the chips CP1 and CP3 without provision to the chips CP2 and CP4. On the other hand, if data need to be exchanged between the chips CP1 and CP3 but no data need to be exchanged between the chips CP2 and CP4, the transferring circuit TRs may be provided in the chips CP2 and CP4 without provision to the chips CP1 and CP3.

Second Embodiment

Figure 9:
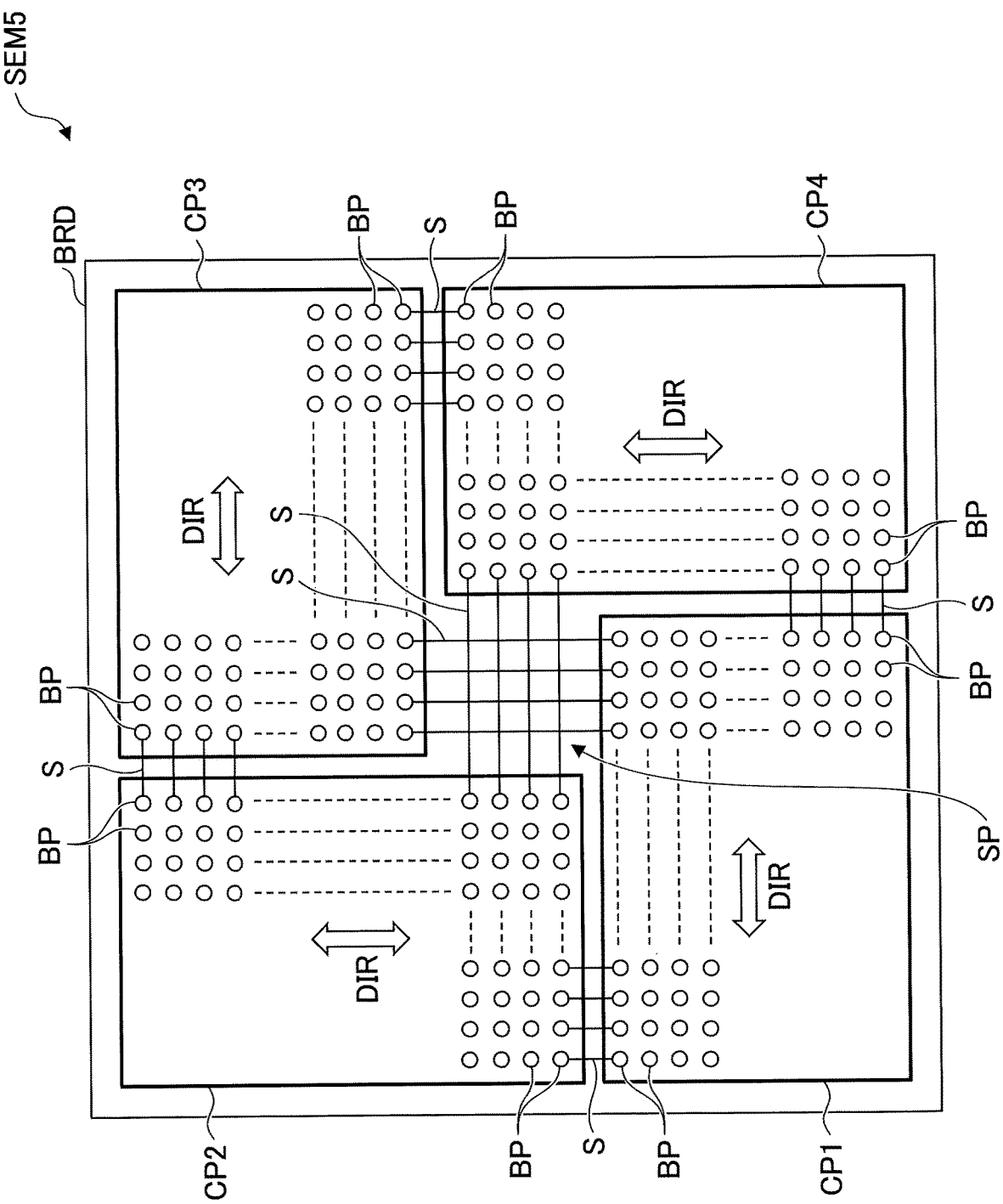
FIG. 9 is a block diagram for illustrating one exemplary semiconductor device according to one embodiment of the present disclosure.

FIG. 9 is a block diagram for illustrating one exemplary semiconductor device according to one embodiment of the present disclosure. A semiconductor device SEM5 as illustrated in FIG. 9 has four semiconductor chips CPs (CP1 to CP4), that is, first to fourth chips mounted on a rectangular substrate BRD in a planar view. Each of the chips CPs has a rectangular shape with two long edges and two short edges. Also, a plurality of bumps are formed on the rear surface opposite to the front surface of the substrate BRD in the respective chips CPs. Note that the bumps BPs are illustrated in FIG. 9 without distinction of the rear surface and the front surface of the respective chips CPs for ease in description.

In other words, the semiconductor device SEM5 in FIG. 9 has the first to fourth chips mounted on the substrate, and the first chip is placed adjacent to the second chip with respect to a planar view. Also, the third chip is placed adjacent to the second chip and is also placed adjacent to two of the chips. In addition, the third chip is placed to face the first chip via an unoccupied area in the substrate that is surrounded with edges of the first to third chips and is exposed from the first to third chips, and first signal lines for coupling between the mutually facing first and third chips via the unoccupied area are wired in the unoccupied area.

Furthermore, the fourth chip is placed adjacent to the first chip and the third chip, and the unoccupied area is surrounded with the first to fourth chips and is exposed on the substrate from the first to fourth chips. Throughout the specification, the terminology "surround" means that an outer circumference is surrounded within some degree of range and does not necessarily mean full surrounding. In other words, in FIG. 9, an almost rectangular area SP surrounded with the four chips CP1 to CP4 in the substrate BRD is the unoccupied area, but no edge of the chips CPs may necessarily exist in a portion of the outer circumference of the unoccupied area SP.

The four chips CP1 to CP4 are placed on the rectangular substrate BRD such that the direction DIR of the long edges of the respective chips CP1 to CP4 differs by 90 degrees, and the long edges and the short edges of the two chips facing respective four edges of the substrate BRD are located on the same line. In other words, in each of the chips CPs, one of the long edges faces one of the short edges of an adjacent chip CP, and the other of the long edges faces the outer circumference of the substrate BRD. Also, in each of the chips CPs, one of the short edges faces one of the long edges of another adjacent chip CP, and the other of the short edges faces the outer circumference of the substrate BRD.

More specifically, one long edge of the first chip CP1 faces one short edge of the second chip CP2, one long edge of the second chip CP2 faces one short edge of the third chip CP3, one long edge of the third chip CP3 faces one short edge of the fourth chip CP4, and one long edge of the fourth chip CP4 faces one short edge of the first chip CP1.

In this embodiment, the chips CP1 to CP4 are placed such that an edge of the first chip CP1 is parallel to a facing edge of the third chip CP3 via the unoccupied area SP and an edge of the second chip CP2 is parallel to a facing edge of the fourth chip CP4 via the unoccupied area SP.

Specifically, the unoccupied area SP, where the chips CP1 to CP4 are not placed, is provided at the center of the substrate BRD including the mounted chips CP1 to CP4. In this manner, the chips CPs are placed on the substrate BRD such that edges of the facing two chips CPs are aligned to edges of the substrate BRD, which can reduce the size of the placement areas of the chips CPs, accordingly, the size of the substrate BRD in this embodiment. As a result, the cost of the semiconductor device SEM5 can be lowered. Also, reduction in the size of the substrate BRD can reduce the size of a printed circuit board or the like having the mounted semiconductor device SEM5, which can lower the cost of systems including the semiconductor device SEM5.

The two chips CPs having mutually adjacent long and short edges are coupled to each other by coupling bumps BPs formed in the respective chips CPs to (wired) signal lines S formed on the substrate BRD. In this case, the number of signal lines S corresponding to the length of a facing portion of the long and short edges can be provided by wiring the signal lines S in an orthogonal direction with respect to the long and short edges.

Also, the two chips CPs facing via the unoccupied area SP are coupled to each other by coupling the bumps BPs formed in the respective chips CPs to the (wired) signal lines S (first and second signal lines) formed on the occupied area SP. In this case, the signal lines S can be placed for edges of the chips CPs adjacent to the unoccupied area (referred to as partial edges hereinafter) by wiring the signal lines S in a direction (the direction toward the partial edges of the facing chips CPs via the unoccupied area SP) orthogonal to the edges of the chips CPs adjacent to the unoccupied area (namely, facing another chip CP via the unoccupied area SP).

In other words, according to this embodiment, the chips CPs facing via the unoccupied area SP can be coupled to each other in the same manner as coupling between the chips CPs having mutually adjacent long and short edges. This is because provision of the unoccupied area SP enables the partial edges having some degree of length in a mutually faced portion of the chips CPs to be formed, which can place the signal lines S between the partial edges in the orthogonal direction.

Accordingly, the number of signal lines S coupling between the chips CPs facing via the unoccupied area SP can be increased, compared to the case where the unoccupied area SP is not provided. As a result, an equal informational amount of data can be exchanged among the four chips CPs. For example, if multiple arithmetic units mounted on the respective chips CP1 to CP4 are used to perform operations, data for use in the arithmetic units and/or operational results can be input and output from and to all of the other chips CPs. Accordingly, the semiconductor device SEM5 is suitable for machine learning for use in data processing using large numbers of data and parameters, particularly deep learning using a neural network.

Also, in the case where an equal informational amount of data can be exchanged among the four chips CPs, for example, the semiconductor device SIM5 can be formed by dividing functionalities implemented with a single chip into the four chips CPs. In this case, the yield indicative of a non-defective rate of the chips CPs can be improved, compared to the case of the functionalities being implemented with a single chip. As a result, the chip cost can be reduced, and the cost of the semiconductor device SEM5 can be lowered.

Also, since bumps BPs formed near the partial edges can be coupled to the signal lines S in the two chips CPs facing via the unoccupied area SP, the lengths of the signal lines S can be made more uniform, which can reduce skew of data transmitted via the signal lines S. As a result, the timing design can be facilitated, and the performance of the semiconductor device SEM5 can be enhanced.

Note that the signal lines S may be formed in a wiring layer of the substrate BRD and may be coupled to electrodes on the substrate BRD via a conductive material provided at a through hole, for example. Then, the chips CPs can be coupled to the signal lines S by soldering the bumps BPs to the electrodes on the substrate BRD. In this embodiment, the conductive material provided in the through hole and the electrodes on the substrate BRD are also portions of the signal lines S.

Figure 10:
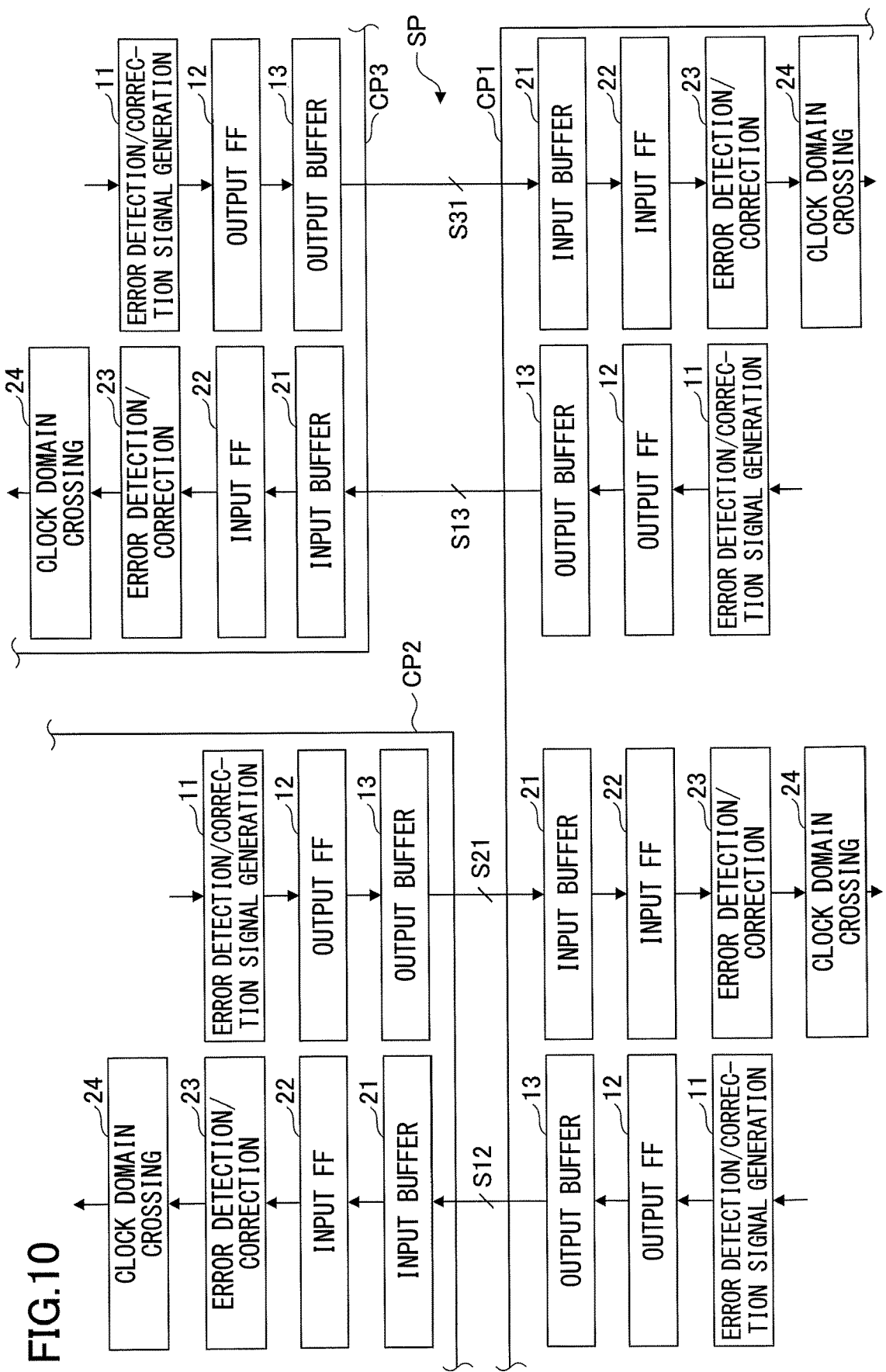
FIG. 10 is a block diagram for illustrating exemplary circuits provided in chips in FIG. 1.

FIG. 10 is a block diagram for illustrating exemplary circuits provided in the chips CPs in FIG. 9. Each of the chips CPs has an error detection/correction signal generation circuit 11, an output flip flop (FF) 12 and an output buffer 13, which correspond to the destination chips CPs of outgoing signals (S12, S21, S13 and S31). Also, each of the chips CPs has an input buffer 21, an input flip flop (FF) 22, an error detection/correction circuit 23 and a clock domain crossing circuit 24, which correspond to the source chips CPs of the outgoing signals S.

The symbol "/" attached to the respective signal lines S12, S21, S13 and S31 indicates that the signal lines S12, S21, S13 and S31 are composed of multiple bits. Signals transmitted in the signal lines S12, S21, S13 and S31 include data, clocks and so on. The number of data bits may be, but not limited to, tens of bits to about 100 bits.

In FIG. 10, a circuit block for inputting and outputting the signals S12 and S21 between the chips CP1 and CP2 and a circuit block for inputting and outputting the signals S13 and S31 between the chips CP1 and CP3 are illustrated. Although not illustrated in FIG. 10, circuit blocks for inputting and outputting the signals S between the chips CP2 and CP3, between the chips CP3 and CP4 and between the chips CP4 and CP1 are the same as the circuit blocks for inputting and outputting the signals S12 and S21 between the chips CP1 and CP2 as illustrated in FIG. 10. A circuit block for inputting and outputting the signals S between the chips CP2 and CP4 is the same as the circuit block for inputting and outputting the signals S13 and S31 between the chips CP1 and CP3 as illustrated in FIG. 10.

In the following, the circuit blocks for inputting and outputting the signals S12 and S21 between the chips CP1 and CP2 are described. In the chip CP1, the error detection/correction signal generation circuit 11 generates an error detection/correction signal for correcting an error in data and outputs the generated error detection/correction signal together with the data to the output FF 12. For example, the error detection/correction signal may be an ECC (Error Correction Code) or the like. The output FF 12 outputs the data, the error detection/correction signal and a clock to the output buffer 13. The output buffer 13 outputs the data, the error detection/correction signal and the clock as the signal S12 of multiple bits to the chip CP2.

The input buffer 21 of the chip CP2 receives the signal of multiple bits from the chip CP1 via the signal line S12 and outputs the received signal to the input FF 22. The input FF 22 fetches the signal S12 in synchronization with the clock for the chip CP1 included in the signal S12 and outputs the fetched signal S12 to the error detection/correction circuit 23.

The error detection/correction circuit 23 uses the error detection/correction signal in the signal to detect or correct an error in the data included in signal S12 and if the error is corrected, outputs the error corrected data to the clock domain crossing circuit 24. In this manner, even if the data received from the chip CP1 via the signal line S12 includes the error, the error corrected data can be processed in the chip CP2.

Note that the error detection/correction circuit 23 performs only the error detection, and in this case, the error detection/correction signal generation circuit 11 of the chip CP1 feeding the signal S12 out in the signal line S12 may generate signals for only the error detection such as parity bits.

If the error detection/correction circuit 23 has detected an error that cannot be corrected, the error detection/correction circuit 23 may generate error information indicative of detection of the error that cannot be corrected. Also, if the error detection/correction circuit 23 has corrected an error in data, the error detection/correction circuit 23 generates correction information indicating that the error has been corrected. Furthermore, if the error detection/correction circuit 23 has detected an error in data, the error detection/correction circuit 23 may generate detection information of detection of the error.

For example, if the error detection/correction circuit 23 has generated the error information, the correction information or the detection information, an internal circuit of the chip CP2 may store the error information, the correction information or the detection information and/or use the error information, the correction information or the detection information to perform information processing such as calculation of an error correction rate. Furthermore, the internal circuit of the chip CP2 may output the error information, the correction information, the detection information, the calculated error correction rate or the like to the chip CP1.

The clock domain crossing circuit 24 converts data in the signal S12 synchronized with the clock of the chip CP1 into data synchronized with the clock of the chip CP2. Then, the internal circuit of the chip CP2 uses the data transferred from the chip CP1 to perform data processing or the like. If the processed data must be returned to the chip CP1, the chip CP2 uses the error detection/correction signal generation circuit 11 to generate an error detection/correction signal for correcting an error in the data returned to the chip CP1. Then, the chip CP2 outputs the generated error detection/correction signal, the data and the clock to the chip CP1 via the output FF 12 and the output buffer 13. The input buffer 21, the input FF 22, the error detection/correction circuit 23 and the clock domain crossing circuit 24 of the chip CP1 operate similar to the input buffer 21, the input FF 22, the error detection/correction circuit 23 and the clock domain crossing circuit 24 of the chip CP2.

Note that the coupling order of the error detection/correction circuit 23 and the clock domain crossing circuit 24 may be reversed. In other words, the error detection/correction circuit 23 may perform error detection on the data synchronized by the clock domain crossing circuit 24 with the clock of the chip CP2 and then arbitrarily perform error correction. Also, the respective chips CP1 to CP4 may not have the error detection/correction signal generation circuit 11 and the error detection/correction circuit 23.

The circuit block for use in transmission of signals from the chip CP1 to the chip CP3 is the same as that for use in transmission of signals from the chip CP1 to the chip CP2 as stated above with the exception of use of the signal lines S13. The circuit block for use in transmission of signals from the chip CP3 to the chip CP1 is the same as that for use in transmission of signals from the chip CP2 to the chip CP1 as stated above with the exception of use of the signal lines S31.

Figure 11:
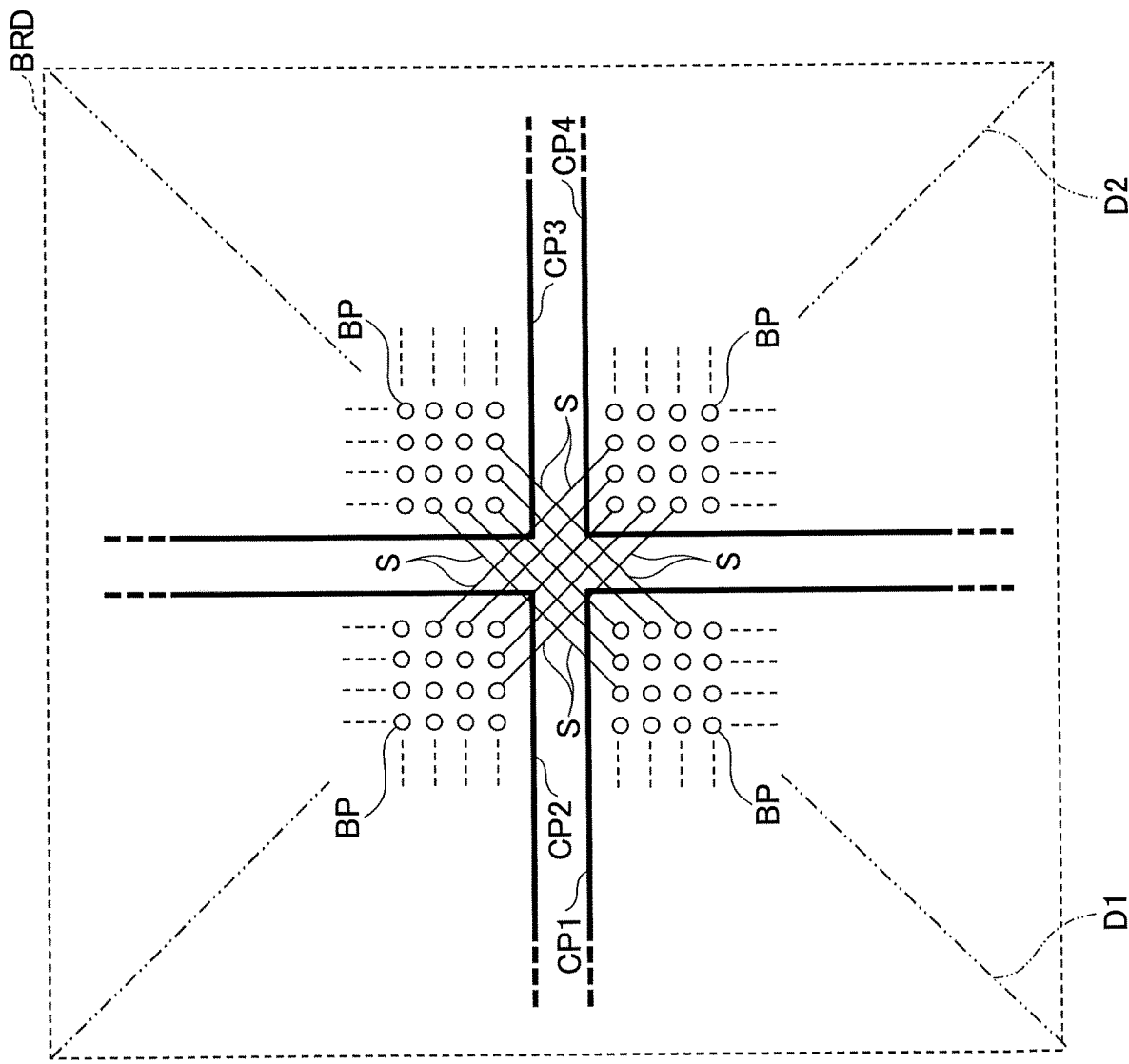
FIG. 11 is an explanatory diagram for illustrating exemplary coupling with signal lines between two diagonally placed chips on a substrate in another semiconductor device where corners of four chips are arranged closely to each other as a comparison example.

FIG. 11 is an explanatory view for illustrating exemplary coupling between the two chips located on the diagonal line D1 (or D2) of the substrate BRD via the signal lines S in another semiconductor device such that corners of the four chips CPs (CP1 to CP4) are closely placed each other. Note that illustration around the intersection point of the diagonal lines D1 and D2 is omitted in FIG. 11 for ease in description.

In FIG. 11, the slanting signal lines S are wired along the diagonal line D1 (or D2) by using bumps BPs provided at corners of the chips CP1 to CP4 located near the intersection point of the diagonal lines D1 and D2. Furthermore, the signal lines S for coupling between the chips CP1 and CP3 intersects the signal lines S for coupling between the chips CP2 and CP4. Accordingly, if a large number of bits of data are exchanged between the chips CP1 and CP3 or between the chips CP2 and CP4, it may be difficult to wire all the signal lines S. Also, if the number of wiring layers in the substrate BRD such as a silicon interposer is increased for the wiring, there are risks of increasing cost and worse signal latency.

Furthermore, as illustrated in FIG. 11, the lengths of the signal lines S may not be uniform depending on positions of the bumps BPs used for coupling, which may lead to skew of the signals S. In contrast, according to the semiconductor device SEM5 in FIG. 9, the signal lines S are wired in the orthogonal direction of edges of the chips CPs mutually facing via the unoccupied area SP, and accordingly the above-stated problems can be reduced.

In this manner, according to the embodiments as illustrated in FIGS. 9 and 10, the wires provided between the facing chips CPs can be easily placed, which can increase the number of signal lines S for coupling between the chips. Accordingly, an equal informational amount of data can be exchanged among the four chips CPs, and the semiconductor device SEM5 can be implemented by dividing functionalities implemented by a single chip CP into the four chips CPs, for example. In this case, the yield indicative of the non-defective rate of the chips CPs can be improved, compared to the case of the functionalities being implemented with the single chip. Accordingly, the chip cost can be reduced, and the cost of the semiconductor device SEM5 can be lowered.

Also, since the signal lines S can be coupled to the bumps BPs provided near partial edges exposed around the unoccupied area SP, the lengths of the signal lines S can be made more uniform, which can reduce the skew of data transmitted via the signal lines S. As a result, the timing design can be facilitated, and the performance of the semiconductor device SEM5 can be enhanced.

Furthermore, the unoccupied area SP can be provided based on placement of the placement areas of the chips CPs (the center of the substrate BRD) by placing the rectangular chips CP1 to CP4 such that the directions DIRs of the respective long edges can differ from each other by 90 degrees, and outer edges of the chips CP1 to CP4 can be aligned to the placement areas (the outer circumference of the substrate BRD). As a result, the size of the placement areas of the chips or the substrate can be decreased while reserving the unoccupied area SP where the signal lines S can be wired.

Figure 12:
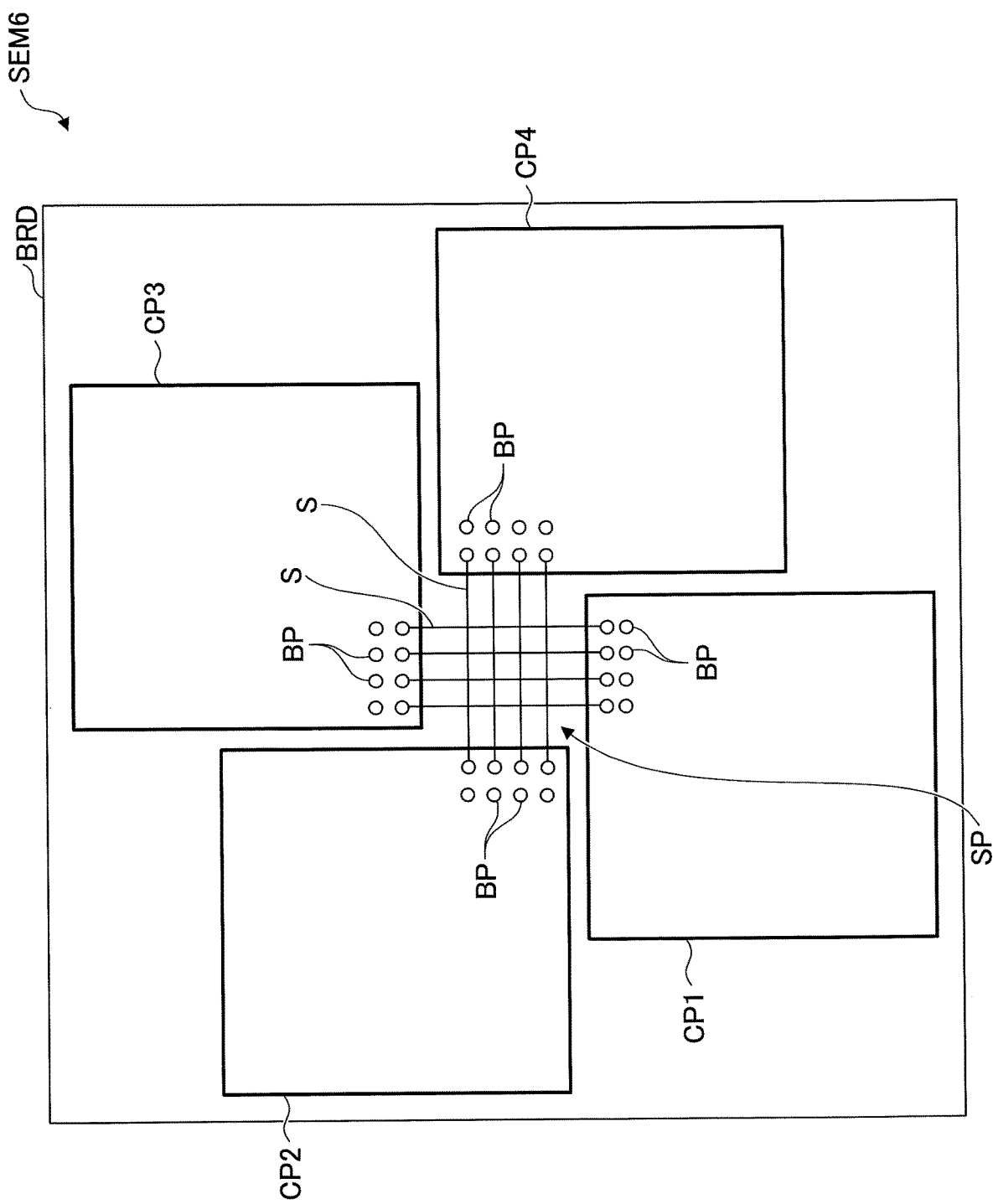
FIG. 12 is a block diagram for illustrating one exemplary semiconductor device according to another embodiment of the present disclosure.

FIG. 12 is a block diagram for illustrating one exemplary semiconductor device according to another embodiment of the present disclosure. The same symbols are attached to elements similar to those in FIG. 9, and descriptions thereof are omitted. A semiconductor device SEM6 as illustrated in FIG. 12 has the same arrangement as that of the semiconductor device SEM5 in FIG. 9 with the exception of chips CPs (CP1 to CP4) having a smaller difference of lengths between long edges and short edges being placed on the substrate BRD. Note that the respective chips CPs may be square.

In the case of the smaller difference of lengths between the long edges and the short edges of the respective chips CPs, if the unoccupied area SP for wiring of the signal lines is provided, the outer edges of the respective chips CPs are not linearly aligned, and some of the outer edges may protrude. In such a case, the size of the placement areas of the chips or the substrate BRD may be determined corresponding to the protruding outer edges.

According to the semiconductor device SEM6 in FIG. 12, the spatial area of the substrate BRD can be larger corresponding to the protruding edges, and the packaging size of the semiconductor device SEM6 may be enlarged, although the wiring scheme of the signal lines S using the unoccupied area SP may be the same as the embodiment in FIG. 9. Accordingly, similar to the embodiment in FIG. 9, the increasing number of signal lines S can be wired between the chips CPs facing via the unoccupied area SP. Also, since the lengths of the signal lines S for coupling between the chips CPs facing via the unoccupied area SP can be made more uniform, the skew of data transmitted via the signal lines S can be reduced. As a result, the timing design can be facilitated, and the performance of the semiconductor device SEM6 can be enhanced.

In the present specification, the terminology "facing" does not necessarily mean that edges face in parallel. Also, the terminologies "parallel", "orthogonal", "linear", "align" or the like are not limited to be used as strict meanings. In other words, the above-stated terminologies are permitted to include some design margins, tolerances or production variations of chips, substrates, semiconductor device or the like.

[Packaging Arrangement]

Next, packaging arrangements of the semiconductor devices according to embodiments of the present disclosure are described with reference to FIGS. 13-16.

Figure 13:
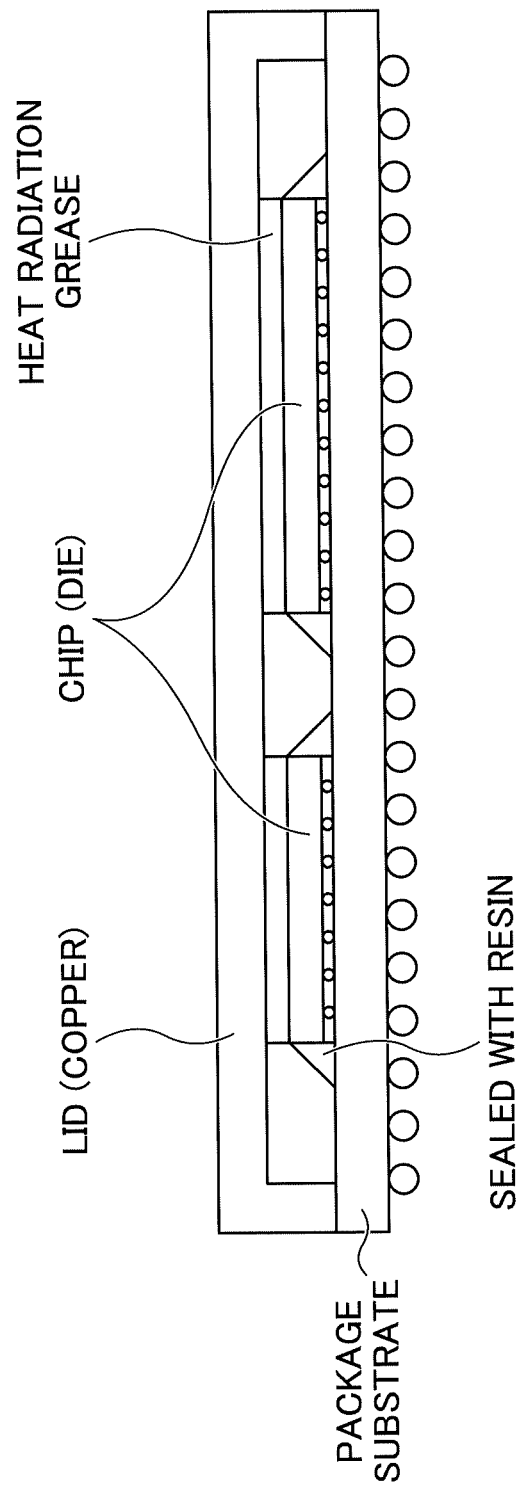
FIG. 13 is a cross-sectional view for illustrating one exemplary semiconductor device according to one embodiment of the present disclosure.

FIG. 13 is a schematic cross-sectional view for illustrating one exemplary packaging arrangement of a semiconductor device according to one embodiment of the present disclosure. As illustrated in FIG. 13, a semiconductor device mounted on a package substrate may be covered with a lid formed of copper, for example. The respective chips may be continuously covered with the lid. As illustrated, the respective chips may be sealed with a resin, and heat radiation greases may be provided between the lid and the respective chips. The respective chips may be continuously sealed with the resin.

Figure 14:
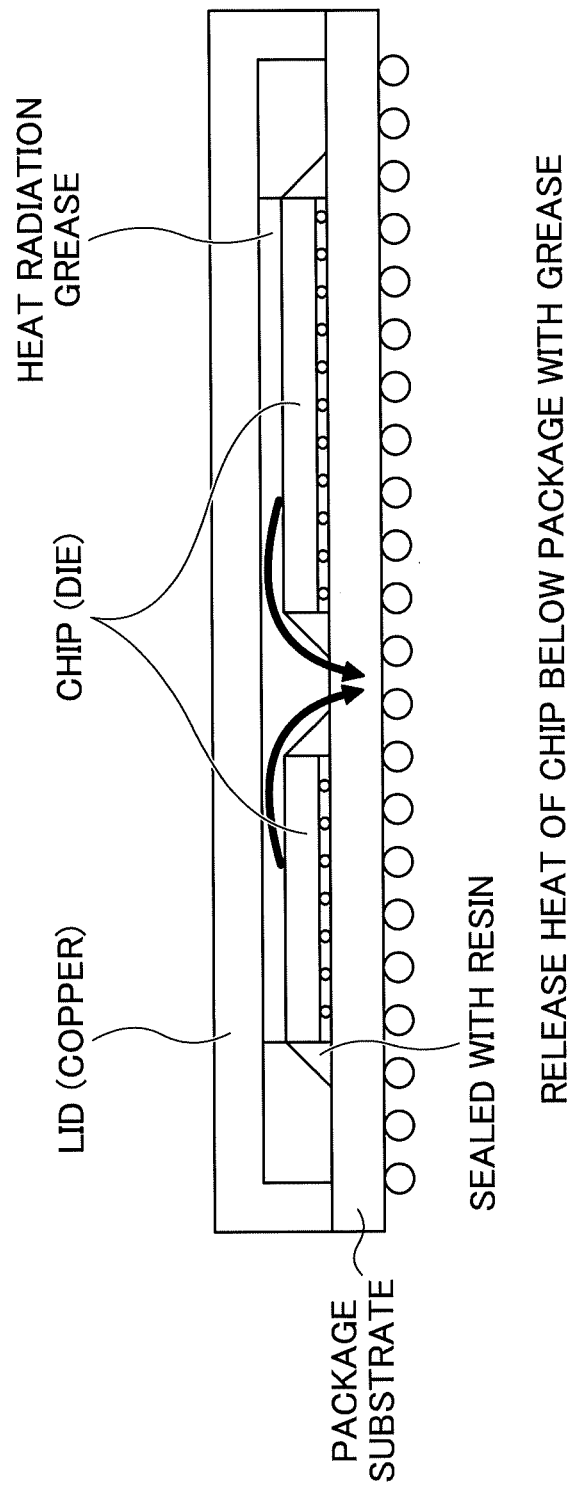
FIG. 14 is a cross-sectional view for illustrating one exemplary semiconductor device according to another embodiment of the present disclosure.

FIG. 14 is a schematic cross-sectional view for illustrating another exemplary packaging arrangement of a semiconductor device according to one embodiment of the present disclosure. As illustrated in FIG. 14, a semiconductor device mounted on a package substrate may be covered with a lid formed of copper, for example. The respective chips may be continuously covered with the lid. As illustrated, the respective chips may be sealed with a resin, and heat radiation greases may be provided not only between the lid and the respective chips but also on an unoccupied area surrounded with the chips. The respective chips may be continuously sealed with the resin and heat radiation grease. According to this arrangement, the heat arising from the chips can be released via the heat radiation grease on the unoccupied area.

Figure 15:
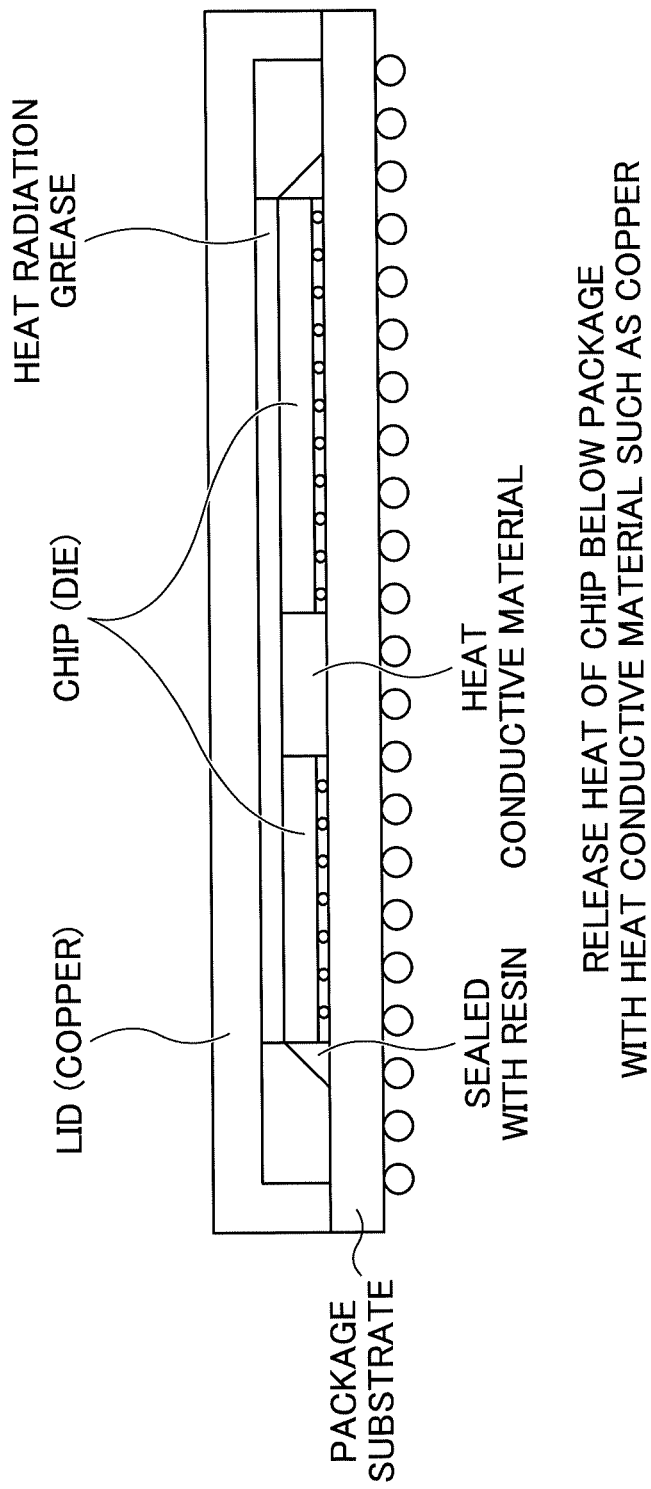
FIG. 15 is a cross-sectional view for illustrating one exemplary semiconductor device according to another embodiment of the present disclosure.

FIG. 15 is a schematic cross-sectional view for illustrating another exemplary packaging arrangement of a semiconductor device according to one embodiment of the present disclosure. As illustrated in FIG. 15, a semiconductor device mounted on a package substrate may be covered with a lid formed of copper, for example. As illustrated, the respective chips may be sealed with a resin, and heat radiation greases may be provided not only between the lid and the respective chips but also above an unoccupied area surrounded with the chips. The respective chips and unoccupied area surrounded with the chips may be continuously sealed with the resin and heat radiation grease. In addition, a heat conductive material such as copper is provided on the unoccupied area between the package substrate and the heat radiation grease. According to this arrangement, the heat arising from the chips can be released via the heat radiation grease and the heat conductive material on the unoccupied area.

FIGS. 16A and 16B are schematic cross-sectional views for illustrating other exemplary packaging arrangements of a semiconductor device according to one embodiment of the present disclosure. As illustrated in FIG. 16A, a semiconductor device mounted on a package substrate may be covered with a heat spreader. Also, a heat conductive sheet may be provided between the heat spreader and the chip. Also, as illustrated in FIG. 16B, a semiconductor device mounted on a package substrate formed of ceramics via flip chip bonding may be covered with a lid.

The present disclosure is not limited to the above-stated specific embodiments, and various variations and modifications can be made without deviating from the scope of claims.

The present application is based on and claims priority to Japanese patent applications No. 2018-231125 and No. 2018-231126 filed on Dec. 10, 2018 with the Japanese Patent Office, the entire contents of which are hereby incorporated by reference.

What is claimed is:

1. A semiconductor device, comprising:
   a first chip;
   a second chip;
   a third chip, and
   a fourth chip, wherein
   the first chip is placed adjacent to the second chip and the fourth chip,
   the third chip is placed adjacent to the second chip and the fourth chip at a position different from that of the first chip,
   the second chip includes a first transferring circuit that transfers data received from the first chip to the third chip via a wiring layer formed over a silicon and placed at a position different from the first chip, the second chip, the third chip, and the fourth chip without performing an arithmetic operation on the data received from the first chip, the first transferring circuit being placed in the second chip.

2. The semiconductor device as claimed in claim 1, wherein each of the first chip, the second chip, the third chip, and the fourth chip is shaped as a rectangle with four edges in a planar view, an edge of one chip of adjacent chips faces an edge of another chip of the adjacent chips.

3. The semiconductor device as claimed in claim 1, wherein the third chip has a third transferring circuit that transfers data received from the second chip to the fourth chip, and the first chip has a fourth transferring circuit that transfers data received from the fourth chip to the second chip.

4. The semiconductor device as claimed in claim 1, wherein the first transferring circuit comprises:
   an error detection/correction circuit that detects or corrects a first error in the data received from one chip of adjacent chips to output the data or corrected data;
   a relaying circuit that relays the data or the corrected data output from the error detection/correction circuit; and
   an error detection/correction signal generation circuit that generates an error detection/correction signal for detecting or correcting a second error in the data relayed by the relaying circuit, and
   the data relayed by the relaying circuit and the error detection/correction signal are transferred to another chip of the adjacent chips.

5. The semiconductor device as claimed in claim 4, wherein the first chip comprises an error detection/correction generation circuit that generates an error detection/correction signal for detecting or correcting the first error in the data to be output to the first transferring circuit, and outputs the data together with the error detection/correction signal to the corresponding transferring circuit, and
   wherein the error detection/correction circuit of the corresponding transferring circuit receives the data and the error detection/correction signal and uses the received error detection/correction signal to detect or correct the first error in the received data.

6. The semiconductor device as claimed in claim 4, wherein the third chip comprises an error detection/correction circuit that upon receiving the data and the error detection/correction signal that are transferred from the first transferring circuit, uses the error detection/correction signal to detect or correct the second error in the received data.

7. The semiconductor device as claimed in claim 1, wherein two adjacently placed chips have input and output circuits that can communicate with each other.

8. A data transferring method for a semiconductor device, wherein the semiconductor device includes a first chip, a second chip, a third chip, and a fourth chip, comprising:
   transferring, by a first transferring circuit, data received from the first chip to the third chip via a first wiring layer formed over a silicon and placed at a position different from the first chip, the second chip, the third chip, and the fourth chip without performing an arithmetic operation on the data received from the first chip, the first chip being placed adjacent to the second chip and the fourth chip, the second chip including the first transferring circuit, and, the first transferring circuit being placed in the second chip.

9. The semiconductor device as claimed in claim 1, wherein the first chip, the second chip, the third chip, and the fourth chip are continuously covered with a lid, the lid being a cover disposed above the first chip, the second chip, the third chip, and the fourth chip.

10. The semiconductor device as claimed in claim 9, wherein the lid is formed of copper.

11. The semiconductor device as claimed in claim 9, wherein the first chip, the second chip, the third chip, and the fourth chip are continuously sealed with a resin.

12. The semiconductor device as claimed in claim 9, wherein the first chip, the second chip, the third chip, and the fourth chip are each sealed with a heat radiation grease.

13. The semiconductor device as claimed in claim 9, wherein the first chip, the second chip, the third chip, and the fourth chip are continuously sealed with a heat radiation grease, and the grease is provided in an unoccupied area surrounded with the first chip, the second chip, the third chip, and the fourth chip.

14. The semiconductor device as claimed in claim 9, wherein the first chip, the second chip, the third chip, the fourth chip, and an unoccupied area surrounded with the first chip, the second chip, the third chip, and the fourth chip are continuously sealed with a heat radiation grease, and a heat conductive material is provided on the unoccupied area surrounded with the first chip, the second chip, the third chip, and the fourth chip.

15. The semiconductor device as claimed in claim 1, wherein the first chip, the second chip, the third chip, and the fourth chip are covered with a heat spreader.

16. The data transferring method as claimed in claim 8, further comprising:
   transferring data received from the second chip to the fourth chip via a third transferring circuit, the fourth chip including the third transferring circuit, and the third transferring circuit being placed in the third chip; and transferring data received from the fourth chip to the second chip via a fourth transferring circuit, the first chip including the fourth transferring circuit, and the fourth transferring circuit being placed in the first chip.

17. The data transferring method as claimed in claim 9, further comprising:
    detecting or correcting, by an error detection/correction circuit, a first error in the data received from one chip of adjacent chips to output the data or corrected data;
    relaying, by a relaying circuit, the data or the corrected data output from the error detection/correction circuit;
    generating, by an error detection/correction signal generation circuit, an error detection/correction signal for detecting or correcting a second error in the data relayed by the relaying circuit; and
    transferring the data relayed by the relaying circuit and the error detection/correction signal to another chip of the adjacent chips.

18. The semiconductor device as claimed in claim 1, wherein
    the first transferring circuit including a circuit configured to convert the data received from the first chip into data synchronized with a clock of the second chip.

19. The semiconductor device as claimed in claim 1, wherein the wiring layer formed over the silicon is a silicon interposer.

20. The semiconductor device as claimed in claim 1, wherein the wiring layer comprising multiple layers.

* * * * *